(12) United States Patent
Yokoyama

(10) Patent No.: US 8,368,046 B2
(45) Date of Patent: *Feb. 5, 2013

(54) LIGHT-EMITTING ELEMENT

(75) Inventor: Shin Yokoyama, Hiroshima (JP)

(73) Assignee: Hiroshima University, Higashihiroshima-Shi, Hiroshima (JP)

( * ) Notice: Subject to any disclaimer, the term of this patent is extended or adjusted under 35 U.S.C. 154(b) by 210 days.

This patent is subject to a terminal disclaimer.

(21) Appl. No.: 12/372,585

(22) Filed: Feb. 17, 2009

(65) Prior Publication Data

US 2009/0206323 A1  Aug. 20, 2009

(30) Foreign Application Priority Data

Feb. 18, 2008 (JP) .................. 2008-035661

(51) Int. Cl.
*H01L 29/06* (2006.01)
*H01L 31/072* (2006.01)
(52) U.S. Cl. .......................... 257/13; 257/14
(58) Field of Classification Search .................... 257/13, 257/14, E29.069, E31.033
See application file for complete search history.

(56) References Cited

U.S. PATENT DOCUMENTS

| | | |
|---|---|---|
| 4,977,357 A | 12/1990 | Shrier |
| 5,354,707 A | 10/1994 | Chapple-Sokol et al. |
| 5,568,504 A | 10/1996 | Kock et al. |
| 6,236,060 B1 | 5/2001 | Chan et al. |
| 6,239,449 B1 | 5/2001 | Fafard et al. |
| 6,254,805 B1 | 7/2001 | Potter |
| 6,358,631 B1 | 3/2002 | Forrest et al. |
| 7,132,297 B2 | 11/2006 | Griglione et al. |
| 7,172,956 B2 | 2/2007 | Hori et al. |
| 7,180,648 B2 | 2/2007 | Dohrman et al. |
| 7,217,959 B2 | 5/2007 | Chen |
| 7,239,081 B2 | 7/2007 | Tsutsui |
| 7,265,374 B2 | 9/2007 | Lee et al. |
| 7,271,417 B2 | 9/2007 | Chen |
| 7,279,716 B2 | 10/2007 | Chen |

(Continued)

FOREIGN PATENT DOCUMENTS

| | | |
|---|---|---|
| JP | 08-076069 | 3/1996 |
| JP | 09-102596 | 4/1997 |

(Continued)

OTHER PUBLICATIONS

2007 International Conference on Solid State Devices and Materials, Tsukuba International Congress Center, Sep. 18-21, 7 pages.

(Continued)

*Primary Examiner* — Hung Vu
(74) *Attorney, Agent, or Firm* — Foley & Lardner LLP

(57) ABSTRACT

A light-emitting element includes a n-type silicon oxide film and a p-type silicon nitride film. The n-type silicon oxide film and the p-type silicon nitride film formed on the n-type silicon oxide film form a p-n junction. The n-type silicon oxide film includes a plurality of quantum dots composed of n-type Si while the p-type silicon nitride film includes a plurality of quantum dots composed of p-type Si. Light emission occurs from the boundary between the n-type silicon oxide film and the p-type silicon nitride film by injecting electrons from the n-type silicon oxide film side and holes from the p-type silicon nitride film side.

12 Claims, 18 Drawing Sheets

U.S. PATENT DOCUMENTS

| | | |
|---|---|---|
| 7,303,937 B2 | 12/2007 | Chen et al. |
| 7,326,908 B2 | 2/2008 | Sargent et al. |
| 7,358,101 B2 | 4/2008 | Yang et al. |
| 7,372,067 B2 | 5/2008 | Todori et al. |
| 7,442,953 B2 | 10/2008 | Augusto |
| 7,473,922 B2 | 1/2009 | Uchiyama et al. |
| 7,501,294 B1 | 3/2009 | Nakagawa |
| 7,522,647 B2 | 4/2009 | Hatori et al. |
| 7,592,618 B2 | 9/2009 | Khang et al. |
| 7,595,508 B2 | 9/2009 | Otsubo et al. |
| 7,615,492 B2 | 11/2009 | Yang et al. |
| 7,629,244 B2 | 12/2009 | Chae et al. |
| 7,679,102 B2 | 3/2010 | Chik et al. |
| 7,683,392 B2 | 3/2010 | Kawaguchi |
| 7,768,032 B2 * | 8/2010 | Makihara et al. ............ 257/103 |
| 7,795,609 B2 | 9/2010 | Huffaker et al. |
| 7,863,760 B2 | 1/2011 | Daniels et al. |
| 7,880,377 B2 | 2/2011 | Orita et al. |
| 7,960,721 B2 | 6/2011 | Belcher et al. |
| 8,044,414 B2 | 10/2011 | Hori et al. |
| 8,089,061 B2 | 1/2012 | Kobayashi et al. |
| 8,089,080 B2 | 1/2012 | Calder et al. |
| 8,242,515 B2 | 8/2012 | Kahen et al. |
| 2002/0136932 A1 | 9/2002 | Yoshida |
| 2003/0021982 A1 | 1/2003 | Kotov |
| 2003/0157325 A1 | 8/2003 | Anders et al. |
| 2005/0064618 A1 | 3/2005 | Brown et al. |
| 2006/0182966 A1 | 8/2006 | Lee et al. |
| 2007/0013300 A1 | 1/2007 | Takahashi et al. |
| 2007/0108888 A1 | 5/2007 | Chen et al. |
| 2007/0158182 A1 | 7/2007 | Takahashi et al. |
| 2008/0007156 A1 | 1/2008 | Gibson et al. |
| 2008/0135914 A1 | 6/2008 | Krishna et al. |
| 2008/0157102 A1 | 7/2008 | Hori et al. |
| 2008/0237628 A1 | 10/2008 | Satoh et al. |
| 2008/0309234 A1 | 12/2008 | Cho et al. |
| 2009/0008628 A1 | 1/2009 | Choi et al. |
| 2009/0039764 A1 | 2/2009 | Cho et al. |
| 2009/0045447 A1 | 2/2009 | Ramaswamy et al. |
| 2009/0046222 A1 | 2/2009 | Miner et al. |
| 2009/0206323 A1 | 8/2009 | Yokoyama |
| 2009/0236584 A1 * | 9/2009 | Makihara et al. ............ 257/13 |
| 2009/0242871 A1 | 10/2009 | Kobayashi et al. |
| 2010/0019261 A1 | 1/2010 | Scianna et al. |
| 2010/0053931 A1 | 3/2010 | Carroll et al. |
| 2010/0176370 A1 * | 7/2010 | Yokoyama et al. ............ 257/13 |
| 2010/0258189 A1 | 10/2010 | Curran |
| 2010/0289061 A1 | 11/2010 | Matsukura |

FOREIGN PATENT DOCUMENTS

| | | |
|---|---|---|
| JP | 10-155838 | 6/1999 |
| JP | 11-266055 | 9/1999 |
| JP | 11-354839 | 12/1999 |
| JP | 2003-332695 | 11/2003 |
| JP | 2005-347465 | 12/2005 |
| JP | 2006-155838 | 6/2006 |
| JP | 2006-225258 | 8/2006 |
| JP | 2006-228916 | 8/2006 |
| JP | 2007-088311 | 4/2007 |

OTHER PUBLICATIONS

Chen, L.Y., et al., "Visible electroluminescence from silicon nanocrystals embedded in amorphous silicon nitride matrix" Applied Physics Letters, vol. 86, Issue. 19 ,193506 (2005), pp. 1-3.

International Search Report for PCT/JP2008/000744, mailed May 27, 2008.

Microprocesses and Nanotechnology Conference, 2004. Digest of Papers. 2004 International, Oct. 26-29, 2004, cover page only.

Notice of Allowance for U.S. Appl. No. 12/601,794, dated Jun. 21, 2011.

Park, Nae-Man., et al., "Band gap engineering of amorphous silicon quantum dots for light-emitting diodes" Applied Physics Letters, Apr. 23, 2001, vol. 78, No. 17, pp: 2575-2577.

Qin, G. G et al., "Visible electroluminescence from semitransparent Au film/extra thin Si-rich silicon oxide film/p-Si structure" Journal of Applied Physics, Aug. 1, 1995, vol. 78, Issue-3, pp. 2006-2009.

Walters, R. J., et al., "Field-effect electroluminescence in silicon nanocrystals" nature materials, Feb. 4, 2005, vol. 4, pp: 143-146.

Zhou, J., et al., "Electroluminescent devices based on amorphous SiN/Si quantum dots/amorphous SiN sandwiched structures" Optics Express, Jan. 5, 2009, pp: 156-162.

International Preliminary Report on Patentability issued for Intl. Pat. Appln. No. PCT/JP2008/000744 on Sep. 28, 2010 (including English Translation issued on Nov. 9, 2010), 12 pp.

Non-Final Office Action for U.S. Appl. No. 13/237,449, mailed on Feb. 21, 2012, 7 pp.

Non-Final Office Action for U.S. Appl. No. 13/237,449, mailed on Jul. 13, 2012, 9 pp.

Notice of Allowance for U.S. Appl. No. 12/439,441, mailed on May 30, 2012, 7 pp.

Written Opinion of the International Searching Authority for Intl. Pat. Appln. No. PCT/JP2008/000744, mailed on May 27, 2008 (including English Translation), 10 pp.

US Notice of Allowance for U.S. Appl. No. 13/237,449 mailed Oct. 15, 2012.

* cited by examiner

FIG. 6
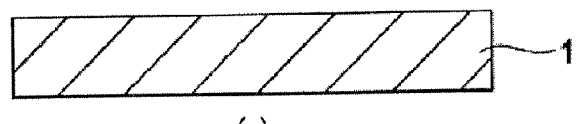
(a)
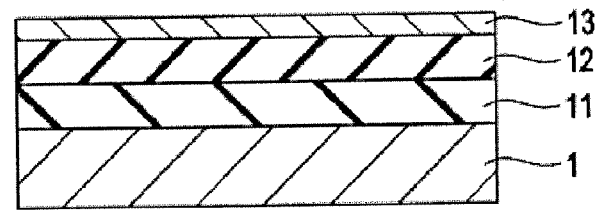
(b)
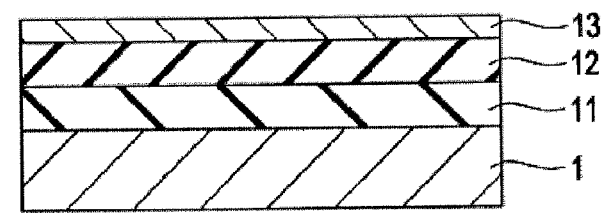
(c)
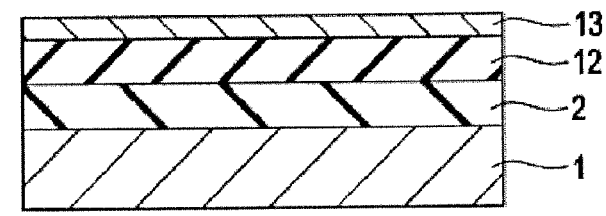
(d)

200

210

FIG. 12
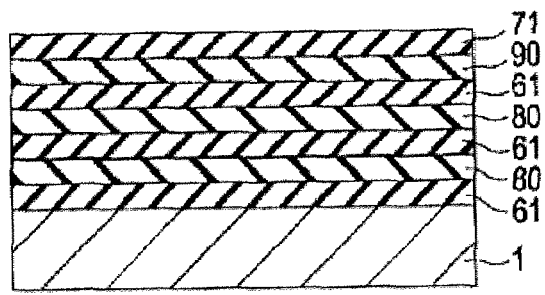
(f)
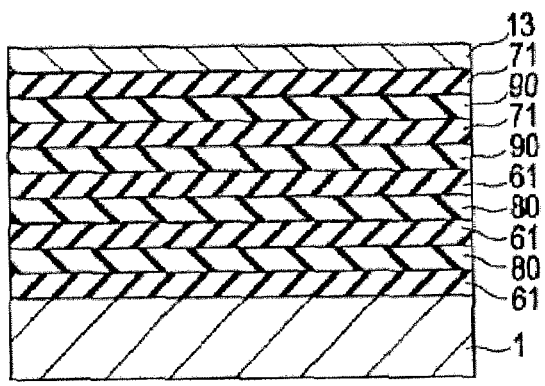
(g)
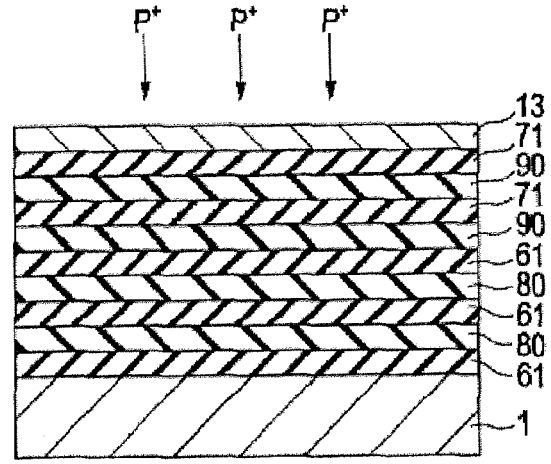
(h)

FIG. 13
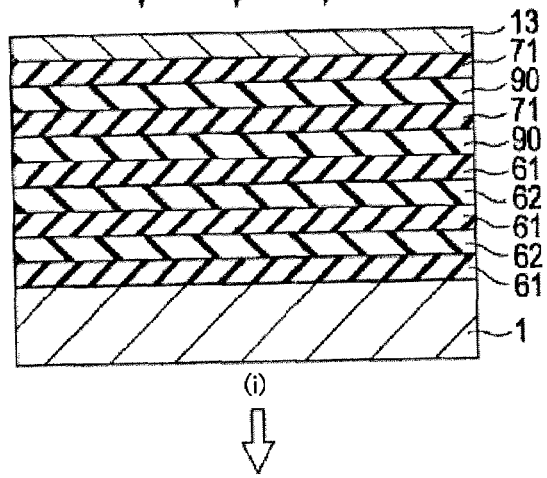
(i)
HEAT TREATMENT
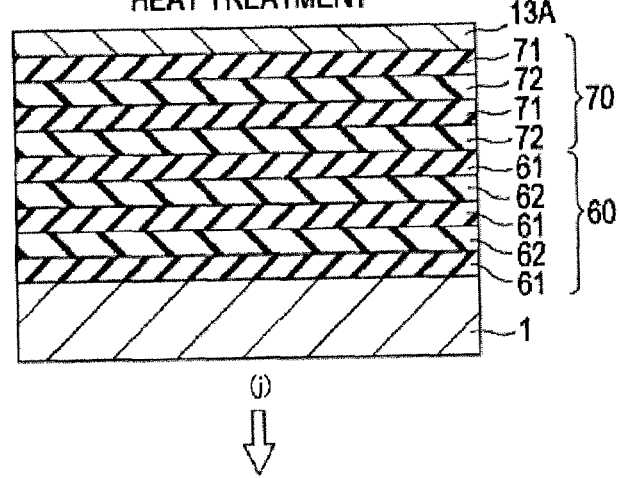
(j)
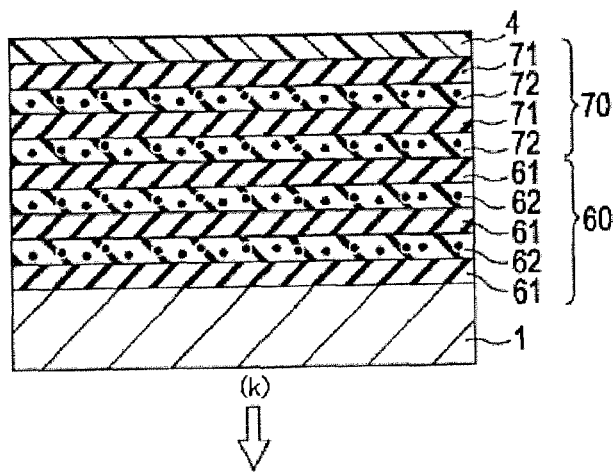
(k)

FIG. 14
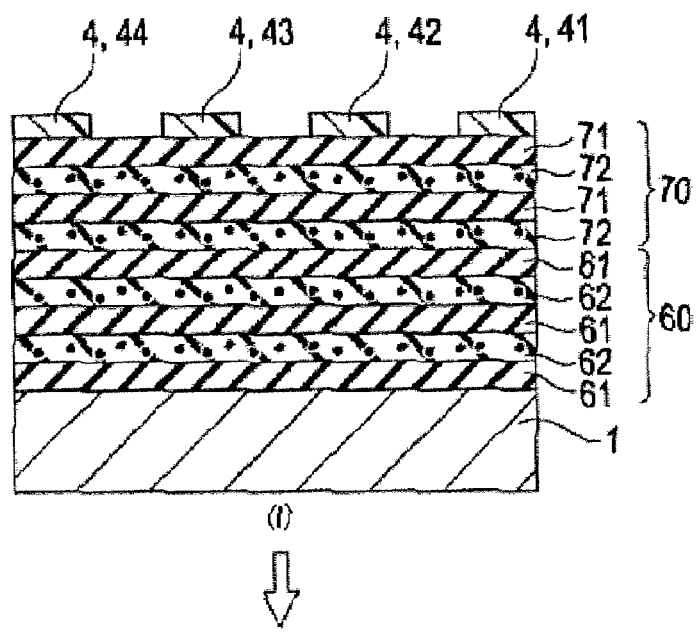
(l)
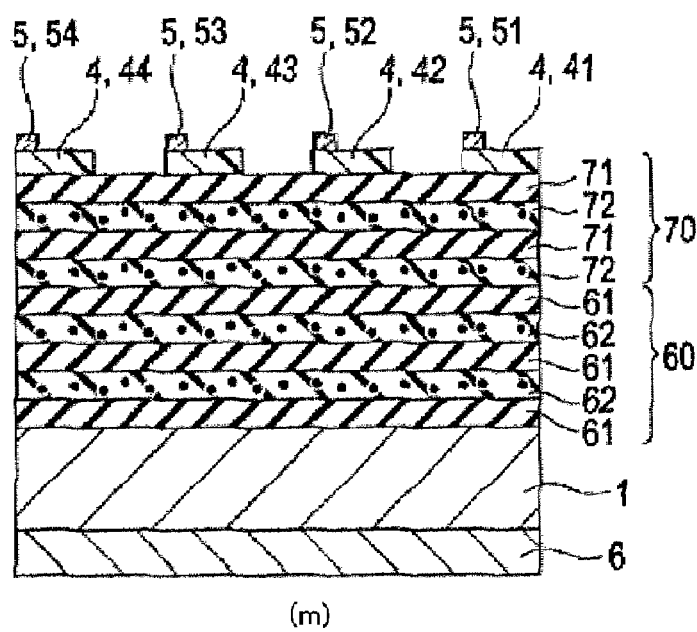
(m)

LIGHT-EMITTING ELEMENT

CROSS-REFERENCE TO RELATED APPLICATION

This application claims priority to Japanese Patent Application No. 2008-035661 filed on Feb. 18, 2008. The entire contents of which are hereby incorporated by reference in its entirety.

BACKGROUND

1. Field

The present specification relates to a light-emitting element and a method for manufacturing the light-emitting element, and particularly to a light-emitting element using quantum dots and a method for manufacturing the light-emitting element.

2. Description of the Related Art

A semiconductor light-emitting element using a semiconductor island structure (quantum dot) has been known (Japanese Unexamined Patent Application Publication No. 2003-332695). Such the semiconductor light-emitting element has a structure of n-type AlGaAs/n-type GaAs/InGaAs island structure/nitrogen-containing compound semiconductor/p-type GaAs/p-type AlGaAs.

The InGaAs island structure has internal stress that comes from compressive stress whereas the nitrogen-containing compound semiconductor has tensile stress. Thus, the internal stress of the InGaAs island structure is reduced by disposing the nitrogen-containing compound semiconductor so as to be in contact with the InGaAs island structure.

As a result, the internal stress of the InGaAs island structure, which is a light-emitting layer, is reduced and an emission spectrum of 1.55 µm is achieved at room temperature.

However, since a quantum dot itself, which is a light-emitting layer, is not controlled to be p-type or n-type in known semiconductor light-emitting elements, the amount of carriers (electrons and holes) injected into the light-emitting layer is small, which causes a problem in that light-emitting efficiency is low.

SUMMARY

Representative embodiments described herein provide a light-emitting element in which light-emitting efficiency can be improved.

The embodiments also provide a method for manufacturing the light-emitting element in which light-emitting efficiency can be improved.

According to a representative embodiment, a light-emitting element includes first and second insulators. The first insulator includes first quantum dots with a first conduction type. The second insulator disposed on the first insulator includes second quantum dots with a second conduction type that is different from the first conduction type.

Preferably, the first insulator includes a plurality of the first quantum dots, and the second insulator includes a plurality of the second quantum dots.

Preferably, the plurality of first quantum dots are irregularly arranged in a thickness direction of the first insulator, and the plurality of second quantum dots are irregularly arranged in a thickness direction of the second insulator.

Preferably, the first conduction type is n-type, and the second conduction type is p-type.

Preferably, a barrier energy against holes is larger than a barrier energy against electrons in the first insulator, and a barrier energy against electrons are larger than a barrier energy against holes in the second insulators.

Preferably, the first quantum dots and the second quantum dots are composed of silicon dots; the first insulator is composed of a silicon oxide film; and the second insulator is composed of a silicon nitride film.

Preferably, the light-emitting element further includes a third insulator formed on the second insulator and including third quantum dots with the second conduction type. The third insulator preferably has a larger barrier energy against electrons than the second insulator.

Preferably, the third insulator includes a plurality of the third quantum dots.

Preferably, the plurality of third quantum dots are irregularly arranged in a thickness direction of the third insulator.

Preferably, the at least one first quantum dot, the second quantum dots, and the third quantum dots are composed of silicon dots; the first insulator is composed of a silicon oxide film; the second insulator is composed of a silicon nitride film; and the third insulator is composed of a silicon oxynitride film.

According to a representative embodiment, a light-emitting element includes a light-emitting layer, a first insulator, and a second insulator. The first insulator supplies electrons to the light-emitting layer through n-type quantum dots. The second insulator supplies holes to the light-emitting layer through p-type quantum dots.

Preferably, the first insulator is composed of a silicon oxide film and the second insulator is composed of a silicon nitride film.

According to a representative embodiment, a method for manufacturing a light-emitting element includes a first step of depositing a first insulator including quantum dots on a principal surface of a semiconductor substrate; a second step of depositing a second insulator including quantum dots on the first insulator; a third step of introducing an impurity of a first conduction type into the first insulator; a fourth step of introducing an impurity of a second conduction type that is different from the first conduction type into the second insulator; and a fifth step of heat-treating the first insulator including the impurity of the first conduction type and the second insulator including the impurity of the second conduction type.

Preferably, in the first step, the first insulator that is composed of a silicon oxide film is deposited on the principal surface by adjusting a flow rate ratio of a second material gas including silicon relative to a first material gas including oxygen, to higher than or equal to a first standard flow rate ratio. Preferably, in the second step, the second insulator that is composed of a silicon nitride film is deposited on the first insulator by adjusting a flow rate ratio of the second material gas relative to a third material gas including nitrogen, to higher than or equal to a second standard flow rate ratio.

Preferably, an n-type impurity is introduced into the first insulator in the third step, and a p-type impurity is introduced into the second insulator in the fourth step.

Preferably, in the fifth step, the first insulator including the n-type impurity and the second insulator including the p-type impurity are heat-treated in a nitrogen atmosphere.

According to a representative embodiment, a method for manufacturing a light-emitting element includes a first step of depositing a first insulator including quantum dots on a principal surface of a semiconductor substrate; a second step of depositing a second insulator including quantum dots on the first insulator; a third step of depositing a third insulator including quantum dots on the second insulator, the third insulator having a larger barrier energy against electrons than the second insulator; a fourth step of introducing an impurity of a first conduction type into the first insulator; a fifth step of introducing an impurity of a second conduction type that is different from the first conduction type into the second and third insulators; and a sixth step of heat-treating the first insulator including the impurity of the first conduction type and the second and third insulators including the impurity of the second conduction type.

In the light-emitting element of the present invention, one of electrons and holes are supplied to the boundary between the first insulator and the second insulator through one of quantum dots in the first insulator and quantum dots in the second insulator, and the other one of electrons and holes are supplied to the boundary between the first insulator and the second insulator through the other one of quantum dots in the first insulator and quantum dots in the second insulator. The electrons and holes supplied to the boundary between the first insulator and the second insulator recombine with each other to emit light. In other words, the light-emitting element of the present invention emits light by supplying both the electrons and holes to the boundary between the first insulator and the second insulator.

Thus, light-emitting efficiency can be improved.

BRIEF DESCRIPTION OF THE DRAWINGS

FIG. 6 is a first process chart for describing a method for manufacturing the light-emitting element shown in FIG. 1.

FIG. 12 is a second process chart for describing a method for manufacturing the light-emitting element shown in FIG. 10.

FIG. 13 is a third process chart for describing a method for manufacturing the light-emitting element shown in FIG. 10.

FIG. 14 is a fourth process chart for describing a method for manufacturing the light-emitting element shown in FIG. 10.

DESCRIPTION OF REPRESENTATIVE EMBODIMENTS

Figure 1:
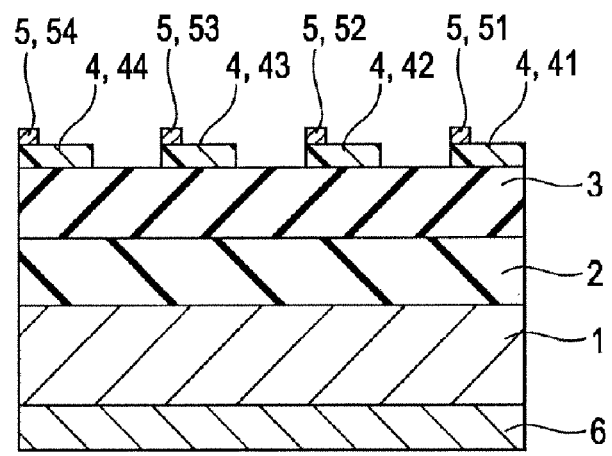
FIG. 1 is a sectional view of a light-emitting element according to an embodiment.

Representative embodiments are described in detail with reference to the drawings. The same or corresponding parts in the drawings are designated by the same reference numerals, and the descriptions are not repeated.

FIG. 1 is a sectional view of a light-emitting element according to an embodiment of the present invention. Referring to FIG. 1, a light-emitting element 10 according to the embodiment of the present invention includes a substrate 1, an n-type silicon oxide film 2, a p-type silicon nitride film 3, $p^+$-type polysilicon ($p^+$ poly-Si) films 4, electrodes 5, and an electrode 6.

The substrate 1 is made of $n^+$-type silicon ($n^+$ Si) with a resistivity of about 0.1Ω·cm. The n-type silicon oxide film 2, as described below, includes a plurality of quantum dots made of n-type Si and is formed on one principal surface of the substrate 1. The n-type silicon oxide film 2 has a film thickness of about 150 nm.

The p-type silicon nitride film 3, as described below, includes a plurality of quantum dots made of p-type Si and is formed on the n-type silicon oxide film 2. The p-type silicon nitride film 3 has a film thickness of about 100 nm.

The $p^+$ poly-Si films 4 are constituted by $p^+$ poly-Si films 41 to 44 and formed on the p-type silicon nitride film 3. The $p^+$ poly-Si films 4 have a boron (B) concentration of about $10^{20}$ cm$^{-3}$ and a film thickness of about 50 nm.

The electrodes 5 are constituted by electrodes 51 to 54, which are formed on the $p^+$ poly-Si films 41 to 44, respectively. Each of the electrodes 51 to 54 is made of aluminum (Al).

The electrode 6 is made of Al and is formed on the rear surface of the substrate 1 (a surface opposite the surface in which the n-type silicon oxide film 2, etc. are formed).

Figure 2:
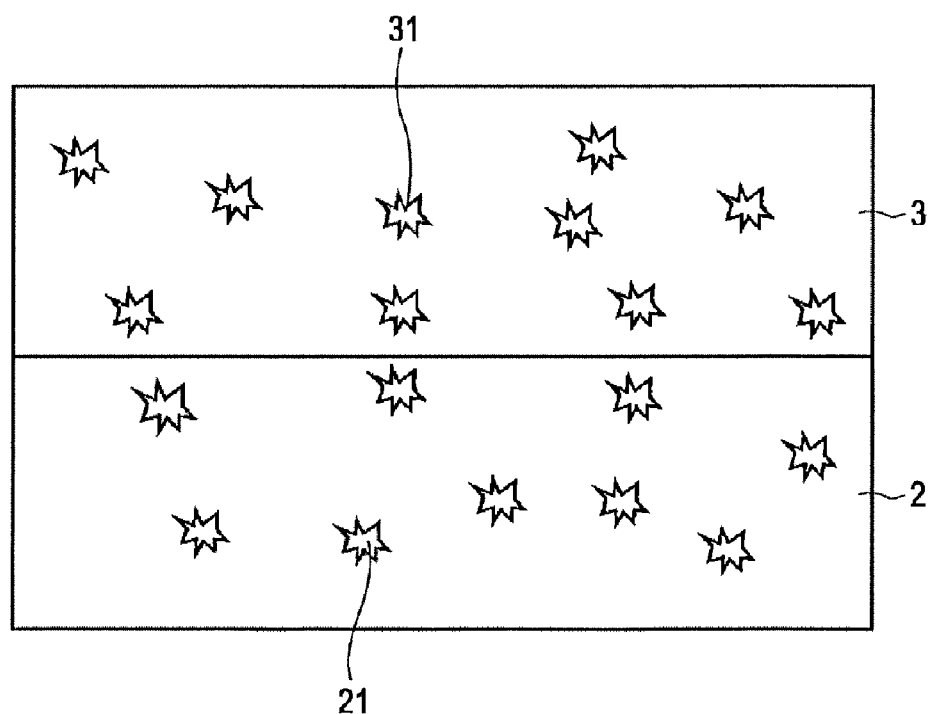
FIG. 2 is an enlarged sectional view of an n-type silicon oxide film and a p-type silicon nitride film shown in FIG. 1.

FIG. 2 is an enlarged sectional view of the n-type silicon oxide film 2 and the p-type silicon nitride film 3 shown in FIG. 1. Referring to FIG. 2, the n-type silicon oxide film 2 includes a plurality of quantum dots 21, each of which is composed of an n-type Si dot and has a phosphorus (P) concentration of about $10^{19}$ cm$^{-3}$. The plurality of quantum dots 21 are irregularly arranged in the n-type silicon oxide film 2.

The p-type silicon nitride film 3 includes a plurality of quantum dots 31, each of which is composed of a p-type Si dot and has a B concentration of about $10^{19}$ cm$^{-3}$. The plurality of quantum dots 31 are irregularly arranged in the p-type silicon nitride film 3.

As described above, the n-type silicon oxide film 2 and the p-type silicon nitride film 3 include the quantum dots 21 each composed of an n-type Si dot and the quantum dots 31 each composed of a p-type Si dot, respectively, and form a p-n junction.

Figure 3:
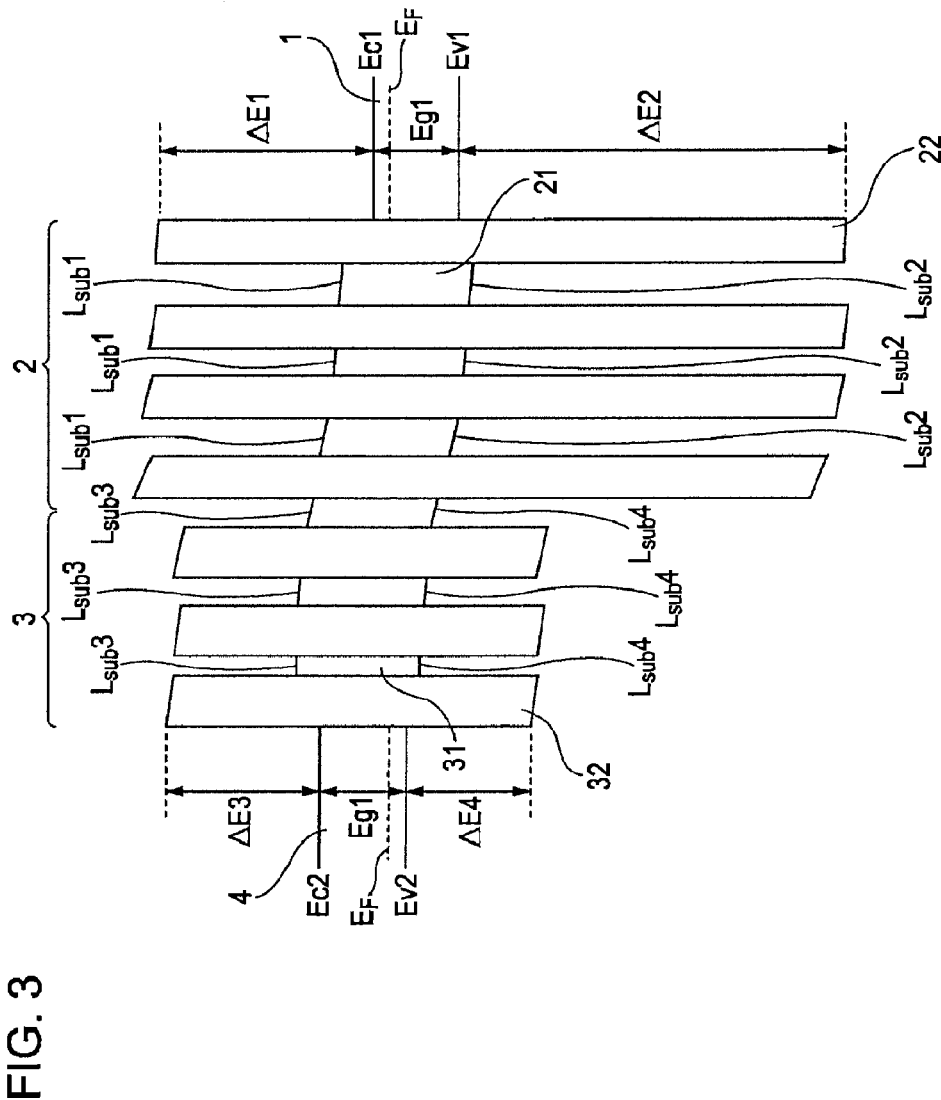
FIG. 3 is an energy band diagram, at zero bias, of the light-emitting element shown in FIG. 1.

FIG. 3 is an energy band diagram, at zero bias, of the light-emitting element 10 shown in FIG. 1. Referring to FIG. 3, a conduction band Ecd and a valence band Ev1 are present in the substrate 1 made of $n^+$ Si, and $n^+$ Si has an energy band gap Eg1 of 1.12 eV.

A conduction band Ec2 and a valence band Ev2 are present in the $p^+$ poly-Si film 4, and the $p^+$ poly-Si film 4 has an energy band gap Eg1 of 1.12 eV.

Since the substrate 1 made of $n^+$ Si is doped with high-concentration P and the $p^+$ poly-Si film 4 is doped with high-concentration B, the energy level of the conduction band Ecd edge of n⁺ Si is close to that of the valence band Ev2 edge of the p⁺ poly-Si film 4.

Since the n-type silicon oxide film 2 includes the plurality of quantum dots 21 as described above, it has a layered structure of the quantum dots 21 and silicon dioxide ($SiO_2$) layers 22 not including the quantum dots 21. Thus, each of the quantum dots 21 is sandwiched by the $SiO_2$ layers 22.

The $SiO_2$ layers 22 have an energy band gap of about 9 eV. Each of the quantum dots 21 sandwiched by two of the $SiO_2$ layers 22 has a sub-level $L_{sub}1$ on the conduction band Ec1 side of n⁺ Si and a sub-level $L_{sub}2$ on the valence band Ev1 side of n⁺ Si due to a quantum size effect.

The sub-level $L_{sub}1$ is higher than the energy level of the conduction band Ec1 of n⁺ Si and the sub-level $L_{sub}2$ is higher than the energy level of the valence band Ev1 edge of n⁺ Si. As a result, the energy difference between the sub-level $L_{sub}1$ and the sub-level $L_{sub}2$ is larger than the energy band gap Eg1 of n⁺ Si.

The energy difference $\Delta E1$ between the conduction band Ecd edge of n⁺ Si and the conduction band edge of the $SiO_2$ layers 22 is about 3.23 eV, and the energy difference $\Delta E2$ between the valence band Ev1 edge of n⁺ Si and the valence band edge of the $SiO_2$ layers 22 is about 4.65 eV. Accordingly, the n-type silicon oxide film 2 has a barrier energy ($=\Delta E1$) against electrons in n⁺ Si that is smaller than a barrier energy ($=\Delta E2$) against holes in n⁺ Si.

Since the p-type silicon nitride film 3 includes the plurality of quantum dots 31 as described above, it has a layered structure of the quantum dots 31 and silicon nitride ($Si_3N_4$) layers 32 not including the quantum dots 31. Thus, each of the quantum dots 31 is sandwiched by the $Si_3N_4$ layers 32.

The $Si_3N_4$ layers 32 have an energy band gap of about 5.2 eV. Each of the quantum dots 31 sandwiched by two of the $Si_3N_4$ layers 32 has a sub-level $L_{sub}3$ on the conduction band Ec2 side of the p⁺ poly-Si film 4 and a sub-level $L_{sub}4$ on the valence band Ev2 side of the p⁺ poly-Si film 4 due to a quantum size effect.

The sub-level $L_{sub}3$ is higher than the energy level of the conduction band Ec2 edge of the p⁺ poly-Si film 4 and the sub-level $L_{sub}4$ is higher than the energy level of the valence band Ev2 edge of the p⁺ poly-Si film 4. As a result, the energy difference between the sub-level $L_{sub}3$ and the sub-level $L_{sub}4$ is larger than the energy band gap Eg1 of the p⁺ poly-Si film 4.

The energy difference $\Delta E3$ between the conduction band Ec2 edge of the p⁺ poly-Si film 4 and the conduction band edge of the $Si_3N_4$ layers 32 is about 2.3 eV, and the energy difference $\Delta E4$ between the valence band Ev2 edge of the p⁺ poly-Si film 4 and the valence band edge of the $Si_3N_4$ layers 32 is about 1.78 eV. Accordingly, the p-type silicon nitride film 3 has a barrier energy ($=\Delta E4$) against holes in the p⁺ poly-Si film 4 that is smaller than a barrier energy ($=\Delta E3$) against electrons in the p⁺ poly-Si film 4.

Figure 4:
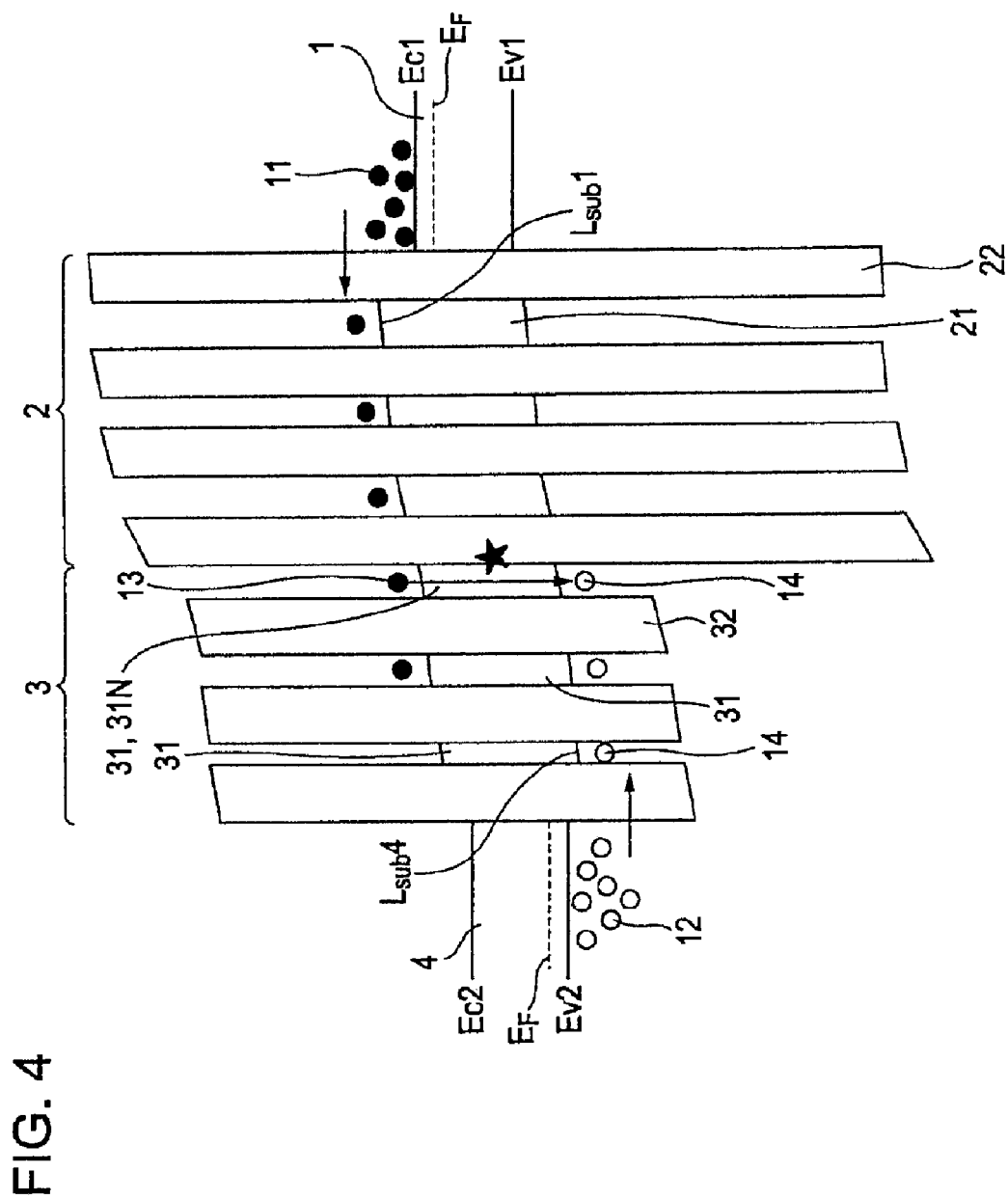
FIG. 4 is an energy band diagram of the light-emitting element shown in FIG. 1 when an electric current is applied.

FIG. 4 is an energy band diagram of the light-emitting element 10 shown in FIG. 1 when an electric current is applied. When a voltage is applied between the electrode 5 and the electrode 6, assuming that the electrode 5 side is positive and the electrode 6 side is negative, the energy band of n⁺ Si constituting the substrate 1 is raised. Consequently, electrons 11 in n⁺ Si flow in the n-type silicon oxide film 2 through the plurality of quantum dots 21 included in the n-type silicon oxide film 2, and are injected into a quantum dot 31N positioned closest to the boundary between the n-type silicon oxide film 2 and the p-type silicon nitride film 3.

In contrast, holes 12 in the p⁺ poly-Si film 4 flow in the p-type silicon nitride film 3 through the quantum dots 31 included in the p-type silicon nitride film 3, and are stored in the quantum dot 31N positioned closest to the boundary between the n-type silicon oxide film 2 and the p-type silicon nitride film 3, because a silicon oxide film functions as a high barrier against holes.

Then, electrons 13 stored in the quantum dot 31N and holes 14 stored in the quantum dot 31N recombine with each other to emit light.

In the light-emitting element 10, as described above, holes are stored in the boundary between the n-type silicon oxide film 2 and the p-type silicon nitride film 3 because a silicon oxide film functions as a high barrier against holes. As a result, light emission occurs from the boundary between the n-type silicon oxide film 2 and the p-type silicon nitride film 3 in the light-emitting element 10.

In the light-emitting element 10, the plurality of quantum dots 21 in the n-type silicon oxide film 2 are doped to be n-type and the plurality of quantum dots 31 in the p-type silicon nitride film 3 are doped to be p-type. Therefore, the sub-level $L_{sub}1$ of the plurality of quantum dots 21 decreases compared with the case where they are not doped to be n-type, while the sub-level $L_{sub}4$ of the plurality of quantum dots 31 decreases compared with the case where they are not doped to be p-type. Consequently, electrons in n⁺ Si easily flow in the n-type silicon oxide film 2 compared with the case where the plurality of quantum dots 21 are not doped to be n-type, such that more electrons are stored in the quantum dot 31N. Similarly, holes in the p⁺ poly-Si film 4 easily flow in the p-type silicon nitride film 3 compared with the case where the plurality of quantum dots 31 are not doped to be p-type, such that more holes are stored in the quantum dot 31N.

Thus, light-emitting efficiency can be improved.

Furthermore, the n-type silicon oxide film 2 irregularly includes the plurality of quantum dots 21 and the p-type silicon nitride film 3 irregularly includes the plurality of quantum dots 31, whereby the injection efficiency of electrons and holes is improved due to the electric-field enhancement effect caused by the irregularly arranged quantum dots 21 and 31.

Thus, light-emitting efficiency can be improved.

Figure 5:
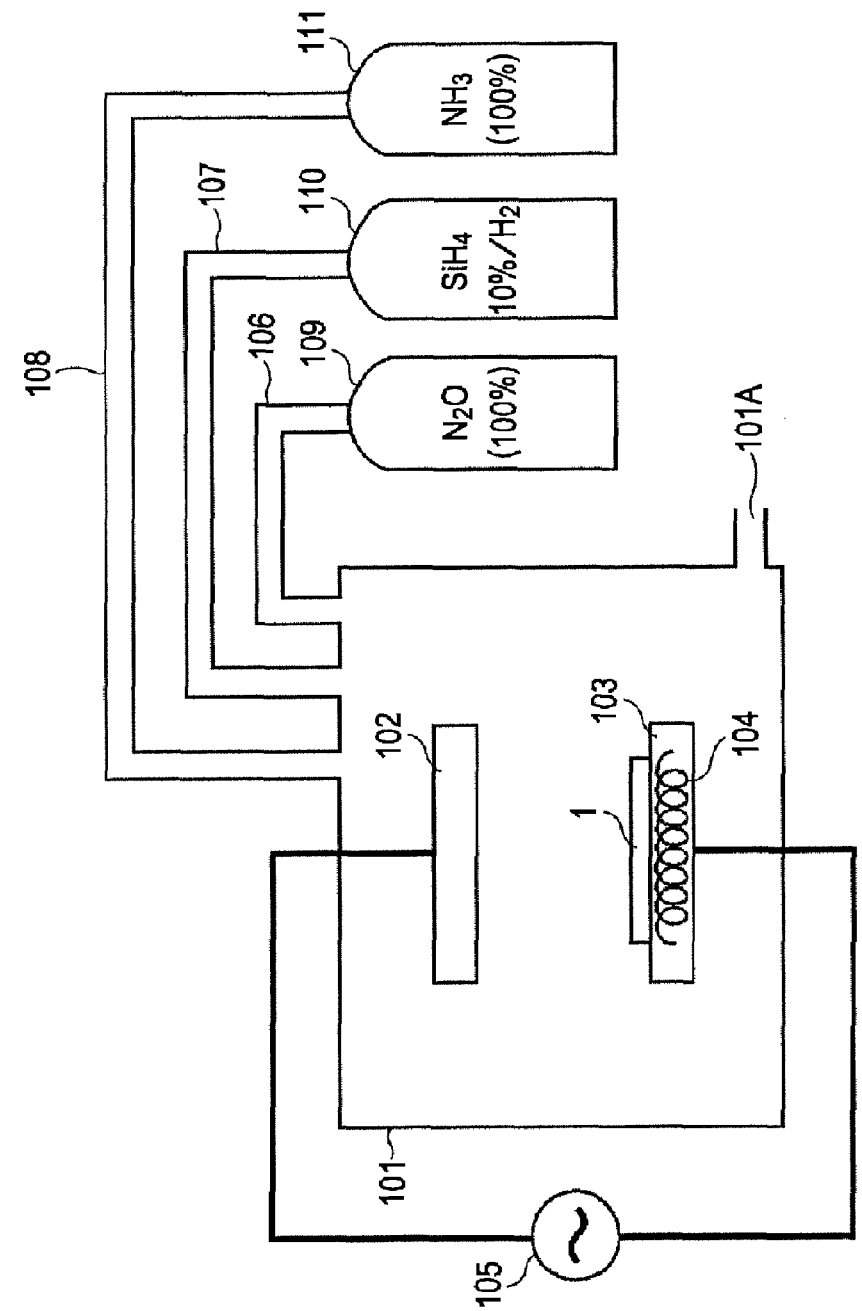
FIG. 5 is a schematic view of a plasma chemical vapor deposition (plasma CVD) apparatus used for manufacturing the light-emitting element shown in FIG. 1.

FIG. 5 is a schematic view of a plasma chemical vapor deposition (plasma CVD) apparatus used for manufacturing the light-emitting element 10 shown in FIG. 1. Referring to FIG. 5, a plasma CVD apparatus 100 includes a reaction chamber 101, an electrode plate 102, a sample holder 103, a heater 104, a radio frequency (RF) power supply 105, pipes 106 to 108, and gas cylinders 109 to 111.

The reaction chamber 101 is a hollow container and has an outlet 101A. The electrode plate 102 and the sample holder 103 each having a diameter of 200 mmφ are plate-shaped and disposed in the reaction chamber 101 so as to be spaced 50 mm apart and substantially parallel. The heater 104 is disposed in the sample holder 103.

The RF power supply 105 is connected to the electrode plate 102 and the sample holder 103. The pipe 106 has one end connected to the reaction chamber 101 and the other end connected to the gas cylinder 109. The pipe 107 has one end connected to the reaction chamber 101 and the other end connected to the gas cylinder 110. The pipe 108 has one end connected to the reaction chamber 101 and the other end connected to the gas cylinder 111.

The sample holder 103 holds a substrate 1. The heater 104 heats the substrate 1 to a desired temperature. The RF power supply 105 applies an RF power of 13.56 MHz between the electrode plate 102 and the sample holder 103.

The gas cylinders 109, 110, and 111 hold N₂O (100%) gas, 10% SiH₄ gas diluted with hydrogen (H₂) gas, and NH₃ (100%) gas, respectively.

The N₂O gas, the SiH₄ gas, and the NH₃ gas are supplied to the reaction chamber 101 through the pipes 106, 107, and 108, respectively. The N₂O gas, the SiH₄ gas, and the NH₃ gas supplied to the reaction chamber 101 are exhausted through the outlet 101A using an exhaust device (not shown) such as a rotary pump. Thus, a determined pressure is achieved in the reaction chamber 101.

In the plasma CVD apparatus 100, a silicon oxide film is deposited on the substrate 1 by applying the RF power between the electrode plate 102 and the sample holder 103 using the RF power supply 105 while the N₂O gas and the SiH₄ gas are supplied to the reaction chamber 101. Alternatively, a silicon nitride film is deposited on the substrate 1 by applying the RF power between the electrode plate 102 and the sample holder 103 using the RF power supply 105 while the NH₃ gas and the SiH₄ gas are supplied to the reaction chamber 101.

Figure 7:
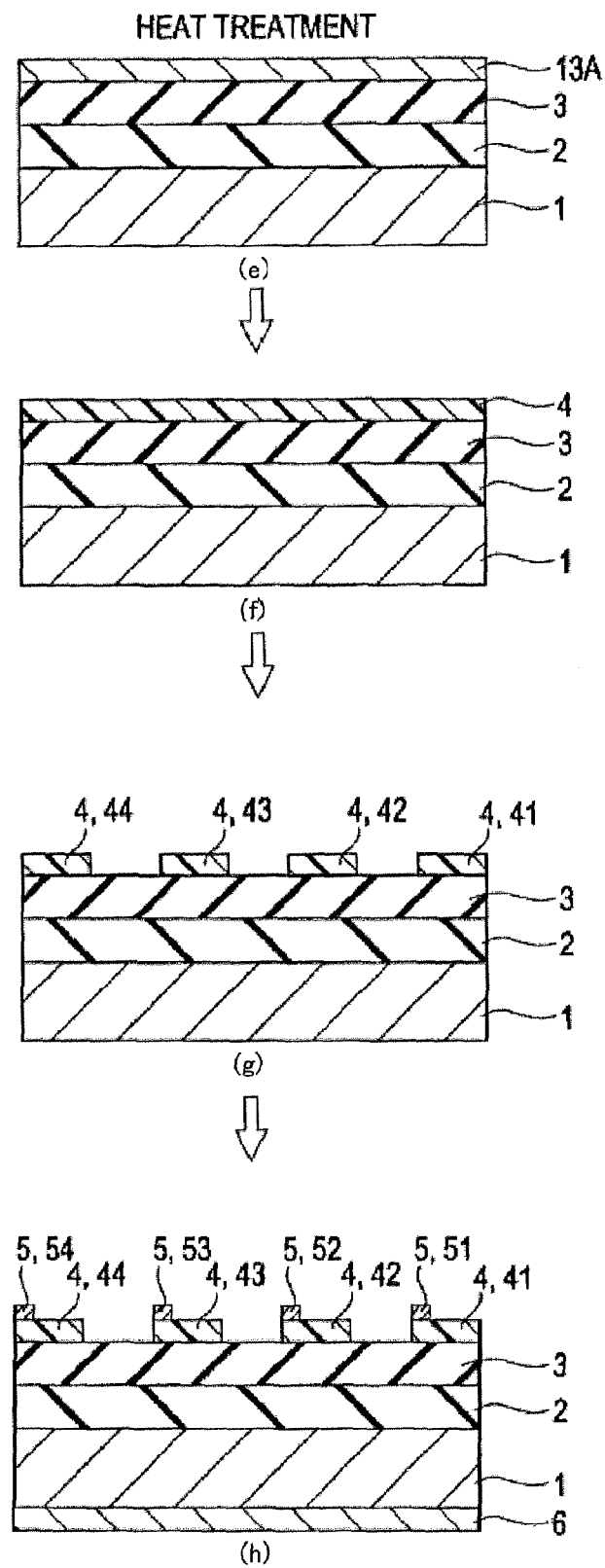
FIG. 7 is a second process chart for describing a method for manufacturing the light-emitting element shown in FIG. 1.

FIGS. 6 and 7 are respectively a first process chart and a second process chart for describing a method for manufacturing the light-emitting element 10 shown in FIG. 1. Referring to FIG. 6, in the manufacturing of the light-emitting element 10, the substrate 1 made of n⁺ Si is prepared (see process (a)), cleaned, and placed on the sample holder 103 of the plasma CVD apparatus 100.

A silicon oxide film 11 is deposited on one principal surface of the substrate 1 under the reaction conditions shown in Table 1.

TABLE 1

| | |
|---|---|
| Flow rate of SiH₄ (10%, diluted with H₂) | 86 sccm |
| Flow rate of N₂O (100%) | 34 sccm |
| Pressure | 133 Pa |
| RF power | 0.32 W/cm² |
| Substrate temperature | 300° C. |
| Reaction time | 3 minutes |

A silicon nitride film 12 is then deposited on the silicon oxide film 11 under the reaction conditions shown in Table 2.

TABLE 2

| | |
|---|---|
| Flow rate of SiH₄ (10%, diluted with H₂) | 92 sccm |
| Flow rate of NH₃ (100%) | 28 sccm |
| Pressure | 133 Pa |
| RF power | 0.32 W/cm² |
| Substrate temperature | 300° C. |
| Reaction time | 4 minutes |

Subsequently, an amorphous silicon (a-Si) film 13 is deposited on the silicon nitride film 12 using the reaction conditions shown in Table 2 under which the NH₃ gas is stopped (see process (b) in FIG. 6).

Phosphorus ions (P⁺) are then injected into the silicon oxide film 11 by ion implantation (see process (c) in FIG. 6). In this case, the acceleration voltage of ion implantation is adjusted such that the P⁺ ions are injected into only the silicon oxide film 11. Thus, an n-type silicon oxide film 2 is formed (see process (d) in FIG. 6).

Boron ions (B⁺) are then injected into the silicon nitride film 12 and the a-Si film 13 by ion implantation (see process (d) in FIG. 6). In this case, the acceleration voltage of ion implantation is adjusted such that the B⁺ ions are injected into only the silicon nitride film 12 and the a-Si film 13. Thus, a p-type silicon nitride film 3 and a p-type a-Si film 13A are formed (see process (e) in FIG. 7).

The resultant structure including the substrate 1/n-type silicon oxide film 2/p-type silicon nitride film 3/p-type a-Si film 13A is annealed under the conditions shown in Table 3.

TABLE 3

| | |
|---|---|
| Annealing temperature | 1000° C. |
| Annealing atmosphere | nitrogen atmosphere |
| Pressure | atmospheric pressure |
| Annealing time | 1 hour |

As a result, P atoms injected into the n-type silicon oxide film 2 and B atoms injected into the p-type silicon nitride film 3 are electrically activated. Furthermore, the p-type a-Si film 13A is converted to a p⁺ poly-Si film 4 (see process (f) in FIG. 7).

The p⁺ poly-Si film 4 is patterned to p⁺ poly-Si films 41 to 44 by photolithography (see process (g) in FIG. 7).

After that, the electrodes 5 (51 to 54) are formed on the p⁺ poly-Si films 41 to 44 by sputtering Al. The electrode 6 is formed on the rear surface of the substrate 1 by sputtering Al (see process (h) in FIG. 7). Thus, the light-emitting element 10 is completed.

As described above, the silicon oxide film 11 including quantum dots is formed by using the reaction conditions shown in Table 1 while the silicon nitride film 12 including quantum dots is formed by using the reaction conditions shown in Table 2. Accordingly, the silicon oxide film 11 including quantum dots or the silicon nitride film 12 including quantum dots can be formed in a single film formation.

The flow rate ratio of the SiH₄ gas relative to the N₂O gas used in the conditions shown in Table 1 under which the silicon oxide film 11 is formed is higher than the flow rate ratio (standard flow rate ratio) of the SiH₄ gas relative to the N₂O gas used to form a SiO₂ film as an insulating film. In other words, the silicon oxide film 11 is formed with a flow rate of SiH₄ gas higher than that of the standard in the present invention; therefore, it is called a silicon-rich oxide film.

The flow rate ratio of the SiH₄ gas relative to the NH₃ gas used in the conditions shown in Table 2 under which the silicon nitride film 12 is formed is higher than the flow rate ratio (standard flow rate ratio) of the SiH₄ gas relative to the NH₃ gas used to form a Si₃N₄ film as an insulating film. In other words, the silicon nitride film 12 is formed with a flow rate of SiH₄ gas higher than that of the standard; therefore, it is called a silicon-rich nitride film.

Accordingly, the silicon oxide film 11 including quantum dots composed of Si dots is formed using the conditions under which the silicon-rich oxide film is formed, whereas the silicon nitride film 12 including quantum dots composed of Si dots is formed using the conditions under which the silicon-rich nitride film is formed.

The density of quantum dots 21 included in the n-type silicon oxide film 2 and quantum dots 31 included in the p-type silicon nitride film 3 can be increased by increasing the flow rate ratio of the SiH₄ gas relative to the N₂O gas and the flow rate ratio of the SiH₄ gas relative to the NH₃ gas, respectively, and by shortening the heat treatment time in the process (e) of FIG. 7 to about a few seconds.

The density of quantum dots 21 included in the n-type silicon oxide film 2 and quantum dots 31 included in the p-type silicon nitride film 3 can be decreased by reducing the flow rate ratio of the SiH₄ gas relative to the N₂O gas and the flow rate ratio of the SiH₄ gas relative to the NH₃ gas, respectively, and by lengthening the heat treatment time in the process (e) of FIG. 7 to several tens of minutes or more.

As described above, the density of the quantum dots 21 included in the n-type silicon oxide film 2 and the quantum dots 31 included in the p-type silicon nitride film 3 can be controlled with the flow rate ratio of the $SiH_4$ gas relative to the $N_2O$ gas and the $NH_3$ gas and the heat treatment time in the process (e) of FIG. 7.

In the method for manufacturing the light-emitting element 10 shown in FIGS. 6 and 7, it has been described that after the silicon oxide film 11 including quantum dots and the silicon nitride film 12 including quantum dots are formed by plasma CVD, the $P^+$ ions and $B^+$ ions are respectively injected into the silicon oxide film 11 and the silicon nitride film 12 by ion implantation to form the n-type silicon oxide film 2 and the p-type silicon nitride film 3. However, the possible embodiments are not limited to this method. The n-type silicon oxide film 2 and the p-type silicon nitride film 3 may be formed by plasma CVD.

In this case, the n-type silicon oxide film 2 is formed by plasma CVD using $PH_3$ gas as a source gas of P whereas the p-type silicon nitride film 3 is formed by plasma CVD using $B_2H_6$ gas as a source gas of B.

Reaction conditions under which the n-type silicon oxide film 2 is formed are specified by adding a flow rate of the $PH_3$ gas to the reaction conditions shown in Table 1. Reaction conditions under which the p-type silicon nitride film 3 is formed are specified by adding a flow rate of the $B_2H_6$ gas to the reaction conditions shown in Table 2.

Furthermore, although it has been described that the n-type silicon oxide film 2 is formed using P in the above description, the present invention is not limited to this. The n-type silicon oxide film 2 may be formed using arsenic (As). In this case, As ions are injected into only the silicon oxide film 11 by ion implantation in the process (c) of FIG. 6. If the n-type silicon oxide film 2 is formed by plasma CVD using As, $AsH_3$ gas is used as a source gas of As.

Figure 8:
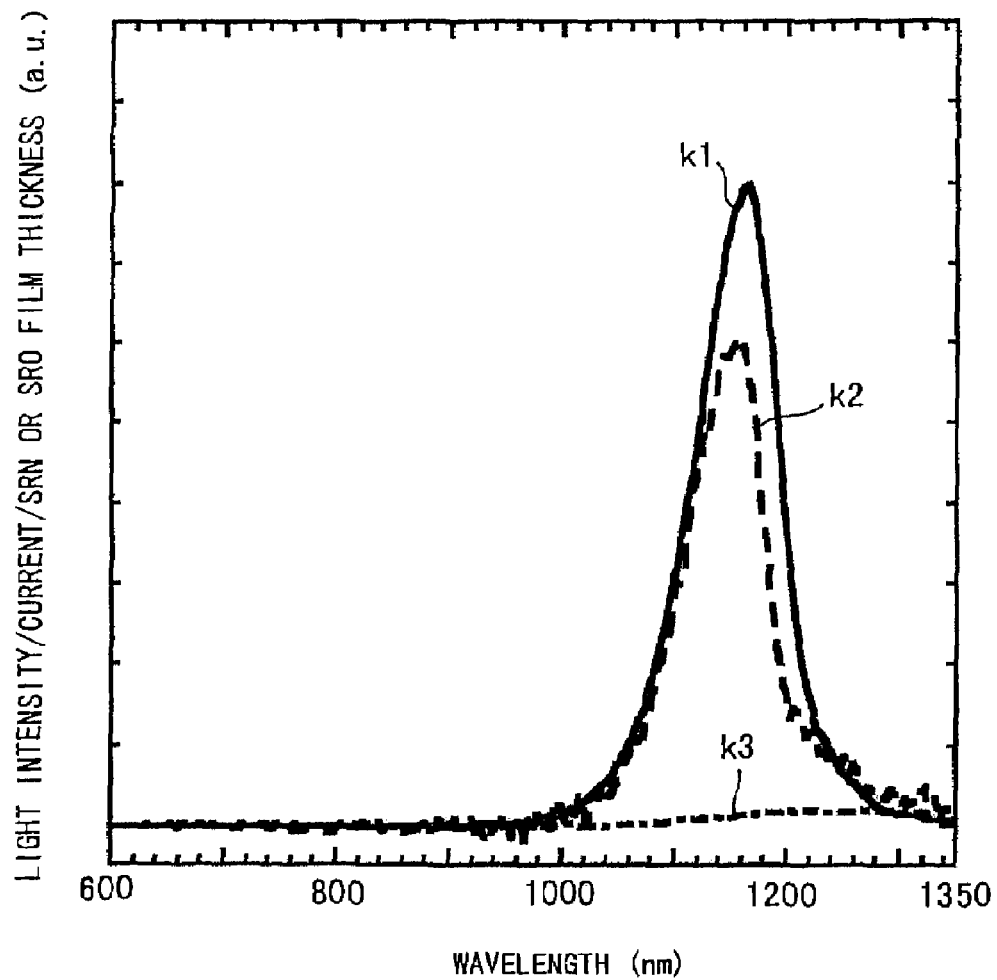
FIG. 8 is a graph showing light-emitting characteristics of the light-emitting element shown in FIG. 1.
Figure 9A:
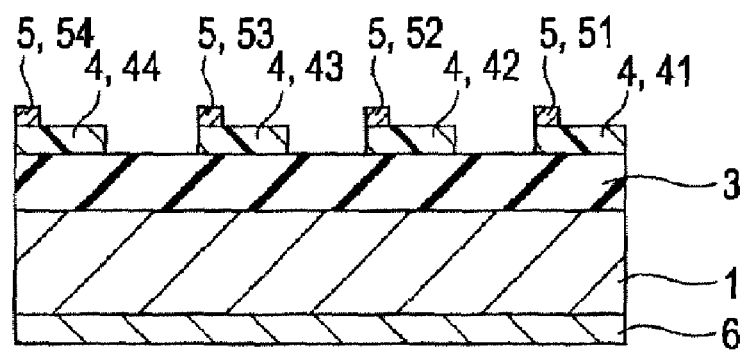
FIGS. 9A and 9B are sectional views of light-emitting elements, which are comparative examples of the light-emitting element shown in FIG. 1.
Figure 9B:
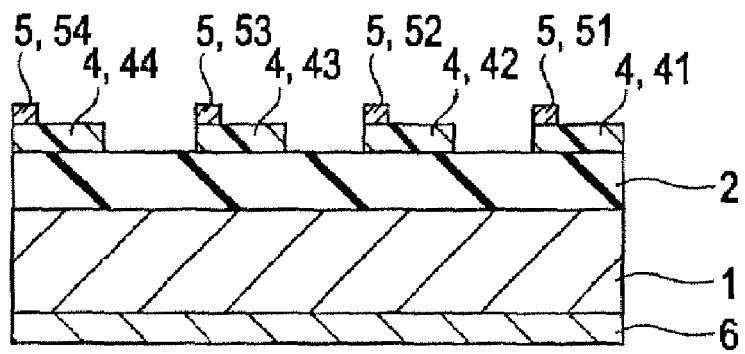

FIG. 8 is a graph showing light-emitting characteristics of the light-emitting element 10 shown in FIG. 1. FIGS. 9A and 9B are sectional views of light-emitting elements, which are comparative examples of the light-emitting element 10 shown in FIG. 1. Referring to FIG. 9A, a light-emitting element 200 is the same as the light-emitting element 10 shown in FIG. 1 except that the n-type silicon oxide film 2 of the light-emitting element 10 is removed. Referring to FIG. 9B, a light-emitting element 210 is the same as the light-emitting element 10 except that the p-type silicon nitride film 3 of the light-emitting element 10 is removed. That is to say, the light-emitting element 200 uses only the p-type silicon nitride film 3 as a light-emitting layer whereas the light-emitting element 210 uses only the n-type silicon oxide film 2 as a light-emitting layer.

FIG. 8 shows light intensity per unit current and unit film thickness as a function of wavelength. A solid curve k1, a dotted curve k2, and a chain curve k3 denote light-emitting intensities of the light-emitting element 10 shown in FIG. 1, the light-emitting element 200 shown in FIG. 9A, and the light-emitting element 210 shown in FIG. 9B, respectively. When the light intensity of the light-emitting element 10 is normalized in terms of film thickness, the film thickness of the p-type silicon nitride film 3 was used, but that of the n-type silicon oxide film 2 was not. This is because 95% of light emission in the light-emitting element 10 occurs from the p-type silicon nitride film 3.

In FIG. 8, SRO in the vertical axis represents a silicon-rich oxide film formed under the silicon-rich reaction conditions shown in Table 1. SRN represents a silicon-rich nitride film formed under the silicon-rich reaction conditions shown in Table 2. The curves k1, k2, and k3 show light-emitting intensities of the light-emitting elements 10, 200, and 210, respectively, when 20 V is applied between the electrodes 5 and the electrode 6.

As evident from FIG. 8, the light-emitting intensity of the light-emitting element 10 is 33% higher than that of the light-emitting element 200 and ten or more times higher than that of the light-emitting element 210. This is because, as described above, the light-emitting element 10 has a structure including a junction between the n-type silicon oxide film 2 and the p-type silicon nitride film 3, which respectively supply electrons and holes to a light-emitting layer through the n-type silicon oxide film 2 and the p-type silicon nitride film 3.

In contrast, either electrons or holes are supplied to a light-emitting layer in the light-emitting element 200 or 210, which produces lower light-emitting intensity than that of the light-emitting element 10.

Therefore, it is experimentally demonstrated that a structure including a junction between the n-type silicon oxide film 2 and the p-type silicon nitride film 3 produces higher light-emitting intensity.

Figure 10:
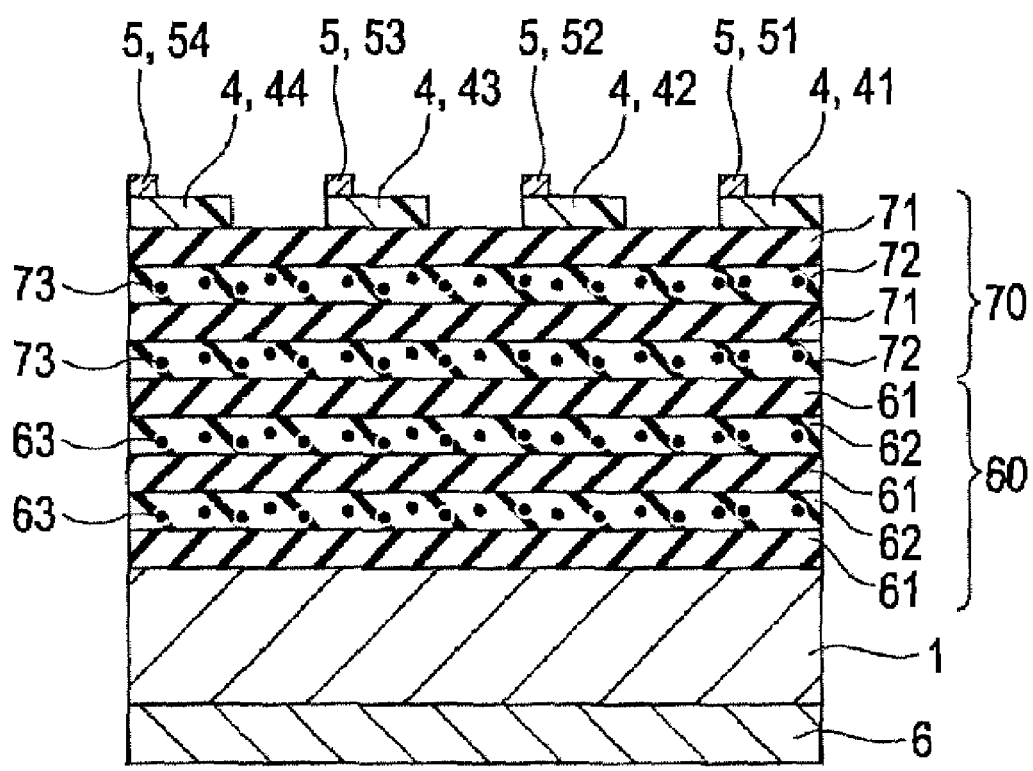
FIG. 10 is a sectional view of another light-emitting element according to an embodiment of the present invention.

FIG. 10 is a sectional view of another light-emitting element according to an embodiment of the present invention. A light-emitting element of the present invention may be a light-emitting element 10A shown in FIG. 10. Referring to FIG. 10, the light-emitting element 10A is the same as the light-emitting element 10 shown in FIG. 1 except that the n-type silicon oxide film 2 of the light-emitting element 10 is replaced with a silicon oxide film 60 and the p-type silicon nitride film 3 is replaced with a silicon nitride film 70.

The silicon oxide film 60 is formed on the substrate 1, and the silicon nitride film 70 is formed on the silicon oxide film 60.

The silicon oxide film 60 includes a plurality of $SiO_2$ films 61 and a plurality of n-type silicon oxide films 62. The plurality of $SiO_2$ films 61 and the plurality of n-type silicon oxide films 62 are alternately stacked in a thickness direction of the light-emitting element 10A. Each of the plurality of n-type silicon oxide films 62 includes a plurality of n-type Si dots 63 irregularly arranged in a film thickness direction thereof. Each of the plurality of $SiO_2$ films 61 has a film thickness of 1 to 5 nm whereas each of the plurality of n-type silicon oxide films 62 has a film thickness of 3 to 10 nm.

The silicon nitride film 70 includes a plurality of $Si_3N_4$ films 71 and a plurality of p-type silicon nitride films 72. The plurality of $Si_3N_4$ films 71 and the plurality of p-type silicon nitride films 72 are alternately stacked in a thickness direction of the light-emitting element 10A. Each of the plurality of p-type silicon nitride films 72 includes a plurality of p-type Si dots 73 irregularly arranged in a film thickness direction thereof. Each of the plurality of $Si_3N_4$ films 71 has a film thickness of 1 to 5 nm whereas each of the plurality of p-type silicon nitride films 72 has a film thickness of 3 to 10 nm.

Each of the plurality of n-type Si dots 63 includes P concentration that is substantially the same as the P concentration in each of the quantum dots 21. Each of the plurality of p-type Si dots 73 includes B concentration that is substantially the same as the B concentration in each of the quantum dots 31.

As described above, the light-emitting element 10A has a structure in which the $SiO_2$ films 61 not including dopants sandwich each of the n-type silicon oxide films 62 and the $Si_3N_4$ films 71 not including dopants sandwich each of the p-type silicon nitride films 72. Accordingly, a light-emitting element may have a structure in which insulators ($SiO_2$ films 61 or $Si_3N_4$ films 71) not including dopants sandwich quantum dots (n-type Si dots 63 or p-type Si dots 73).

Figure 11:
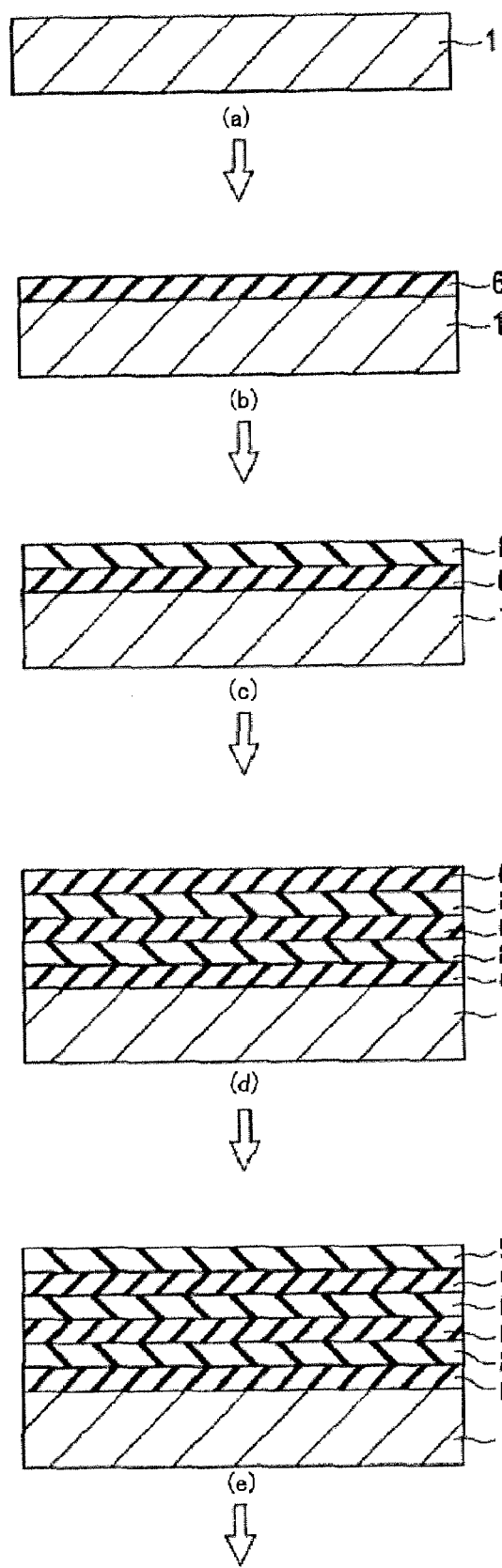
FIG. 11 is a first process chart for describing a method for manufacturing the light-emitting element shown in FIG. 10.

Next, a method for manufacturing the light-emitting element 10A is described. FIGS. 11 to 14 are respectively first, second, third, and fourth process charts for describing a method for manufacturing the light-emitting element 10A shown in FIG. 10. Referring to FIG. 11, in the manufacturing of the light-emitting element 10A, a substrate 1 is prepared (see process (a) in FIG. 11), cleaned, and a SiO$_2$ film 61 is formed on one principal surface of the substrate 1 by plasma CVD using SiH$_4$ gas and N$_2$O gas as a raw material (see process (b) in FIG. 11). In this case, the SiO$_2$ film 61 is formed under the reaction conditions shown in Table 1 with a SiH$_4$ gas flow rate of 86 sccm and a N$_2$O gas flow rate of 200 sccm.

Subsequently, a silicon oxide film 80 is deposited on the SiO$_2$ film 61 by plasma CVD using the SiH$_4$ gas and the N$_2$O gas as a raw material under the reaction conditions shown in Table 1 (see process (c) in FIG. 11).

A plurality of SiO$_2$ films 61 and a plurality of silicon oxide films 80 are alternately formed on the substrate 1 by repeating the processes (b) and (c) in FIG. 11 (see process (d) in FIG. 11).

After that, a silicon nitride film 90 is deposited on the top layer of the SiO$_2$ films 61 by plasma CVD using the SiH$_4$ gas and NH$_3$ gas as a raw material under the reaction conditions shown in Table 2 (see process (e) in FIG. 11).

A Si$_3$N$_4$ film 71 is deposited on the silicon nitride film 90 by plasma CVD using the SiH$_4$ gas and the NH$_3$ gas as a raw material (see process (f) in FIG. 12). In this case, the Si$_3$N$_4$ film 71 is formed under the reaction conditions shown in Table 2 with a SiH$_4$ gas flow rate of 92 sccm and a NH$_3$ gas flow rate of 150 sccm. A plurality of Si$_3$N$_4$ films 71 and a plurality of silicon nitride films 90 are then alternately formed on the top layer of the SiO$_2$ films 61 by repeating the processes (e) and (f) in FIGS. 11 and 12. An a-Si film 13 is deposited on the top layer of Si$_3$N$_4$ film 71 using the reaction conditions shown in Table 2 under which the NH$_3$ gas is stopped (see process (g) in FIG. 12).

P$^+$ ions are then injected into the plurality of silicon oxide films 80 by ion implantation (see process (h) in FIG. 12). In this case, the acceleration voltage of ion implantation is adjusted such that the P$^+$ ions are injected into only the plurality of silicon oxide films 80. Thus, a plurality of n-type silicon oxide films 62 are formed (see process (i) in FIG. 13).

B$^+$ ions are then injected into the plurality of silicon nitride films 90 and the a-Si film 13 by ion implantation (see process (j) in FIG. 13). In this case, the acceleration voltage of ion implantation is adjusted such that the B$^+$ ions are injected into only the plurality of silicon nitride films 90 and the a-Si film 13. Thus, the plurality of p-type silicon nitride films 72 and the p-type a-Si film 13A are formed (see process a) in FIG. 13).

The resultant structure including the substrate 1/SiO$_2$ film 61/n-type silicon oxide film 62/ . . . /SiO$_2$ film 61/p-type silicon nitride film 72/Si$_3$N$_4$ film 71/ . . . /Si$_3$N$_4$ film 71/p-type a-Si film 13A is annealed under the conditions shown in Table 3.

As a result, P atoms injected into the n-type silicon oxide films 62 and B atoms injected into the p-type silicon nitride films 72 are electrically activated. Furthermore, the p-type a-Si film 13A is converted to the p$^+$ poly-Si film 4 (see process (k) in FIG. 13).

The p$^+$ poly-Si film 4 is patterned to p$^+$ poly-Si films 41 to 44 by photolithography (see process (l) in FIG. 14).

After that, the electrodes 5 (51 to 54) are formed on the p$^+$ poly-Si films 41 to 44 by sputtering Al. The electrode 6 is formed on the rear surface of the substrate 1 by sputtering Al (see process (m) in FIG. 14). Thus, the light-emitting element 10A is completed.

An energy band diagram of the light-emitting element 10A shown in FIG. 10 at zero bias is the one shown in FIG. 3. An energy band diagram of the light-emitting element 10A when an electric current is applied is the one shown in FIG. 4. Accordingly, the light-emitting element 10A emits light through the same mechanism as the light-emitting element 10 described above.

Therefore, light-emitting efficiency can also be improved in the light-emitting element 10A.

Figure 15:
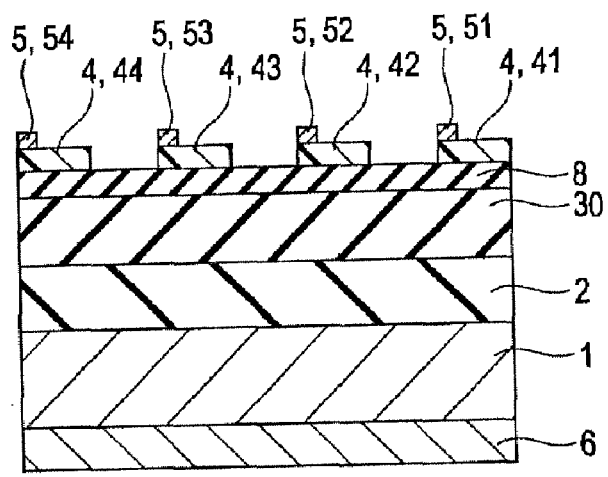
FIG. 15 is a sectional view of still another light-emitting element according to an embodiment of the present invention.

FIG. 15 is a sectional view of still another light-emitting element according to an embodiment of the present invention. A light-emitting element according to an embodiment may be a light-emitting element 10B shown in FIG. 15. Referring to FIG. 15, the light-emitting element 10B is the same as the light-emitting element 10 shown in FIG. 1 except that the p-type silicon nitride film 3 of the light-emitting element 10 is replaced with a p-type silicon nitride film 30 and a p-type silicon oxynitride film 8 is further added.

The p-type silicon nitride film 30 with a film thickness of about 10 nm has the same composition as the p-type silicon nitride film 3.

The p-type silicon oxynitride film 8 is formed between the p-type silicon nitride film 30 and the p$^+$ poly-Si film 4 so as to be in contact with both of them. The p-type silicon oxynitride film 8 with a film thickness of about 100 nm, as described below, includes a plurality of quantum dots composed of p-type Si and has a composition of SiO$_1$N$_{0.33}$.

Figure 16:
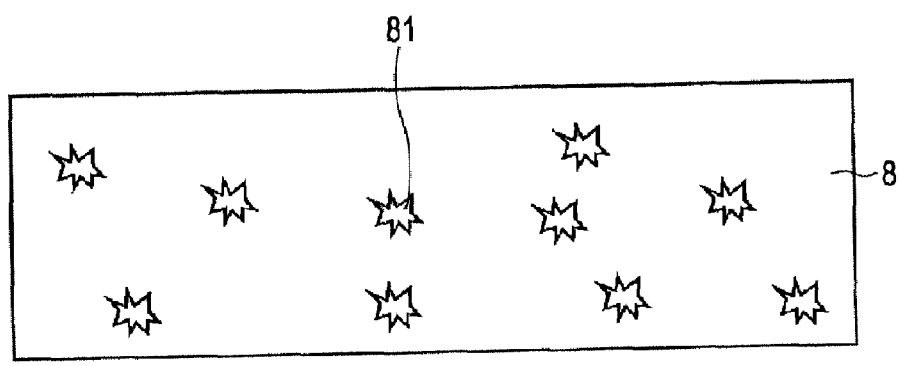
FIG. 16 is an enlarged sectional view of a p-type silicon oxynitride film shown in FIG. 15.

FIG. 16 is an enlarged sectional view of the p-type silicon oxynitride film 8 shown in FIG. 15. Referring to FIG. 16, the p-type silicon oxynitride film 8 includes a plurality of quantum dots 81, each composed of a p-type Si dot and having a B concentration of about $10^{19}$ cm$^{-3}$. The plurality of quantum dots 81 are irregularly arranged in the p-type silicon oxynitride film 8.

Figure 17:
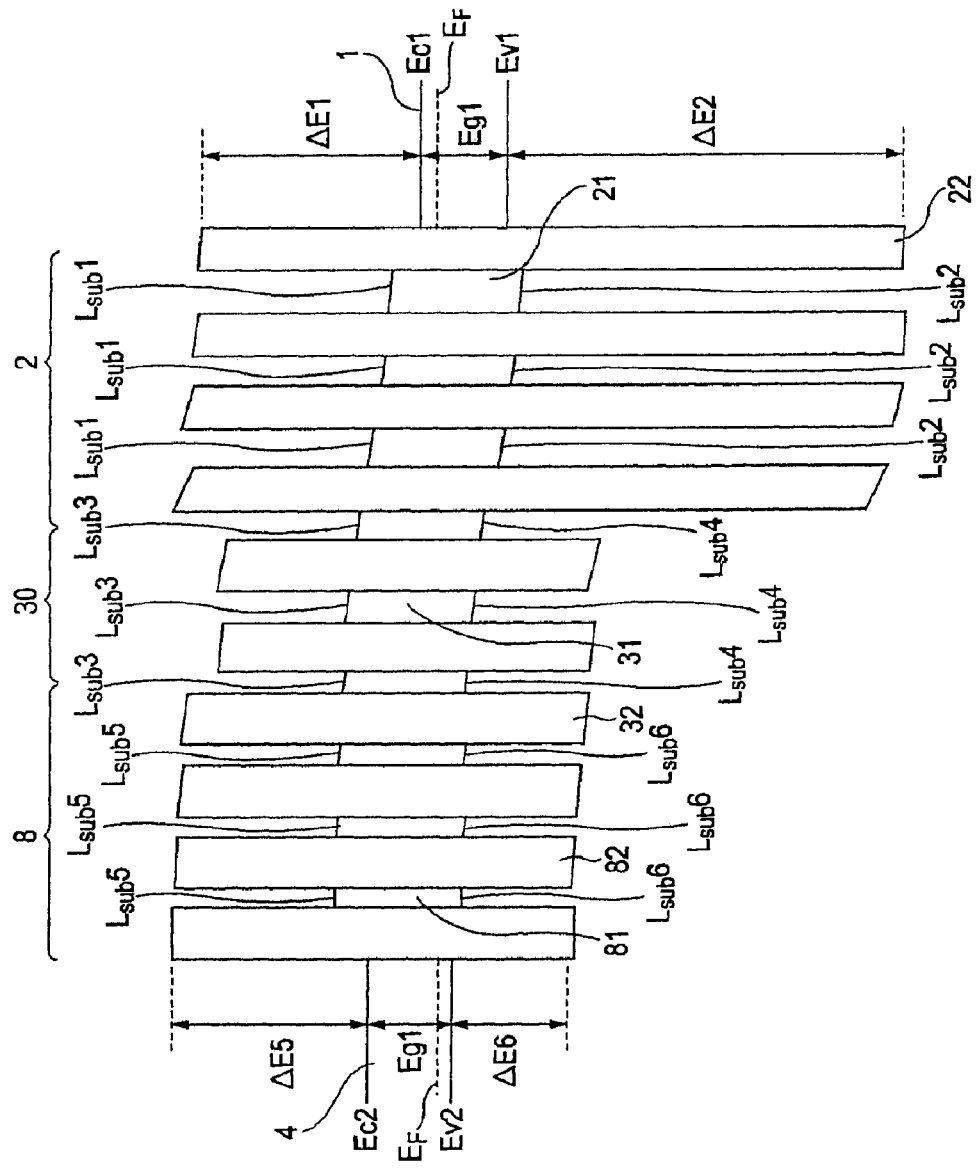
FIG. 17 is an energy band diagram, at zero bias, of the light-emitting element shown in FIG. 15.

FIG. 17 is an energy band diagram, at zero bias, of the light-emitting element 10B shown in FIG. 15. Referring to FIG. 17, the energy band diagram of the n-type silicon oxide film 2 and the p-type silicon nitride film 30 is as described in FIG. 3.

Since the p-type silicon oxynitride film 8 includes the plurality of quantum dots 81 as described above, it has a layered structure of the quantum dots 81 and silicon oxynitride film layers 82 not including the quantum dots 81. As a result, each of the quantum dots 81 is sandwiched by the silicon oxynitride film layers 82.

The silicon oxynitride film layers 82 have an energy band gap of about 7.1 eV. Each of the quantum dots 81 sandwiched by two of the silicon oxynitride film layers 82 has a sub-level L$_{sub}$5 on the conduction band Ec2 side of p+Si and a sub-level L$_{sub}$6 on the valence band Ev2 side of p$^+$ Si due to a quantum size effect.

The sub-level L$_{sub}$5 is higher than the energy level of the conduction band Ec2 of the p$^+$ Si and the sub-level L$_{sub}$6 is higher than the energy level of the valence band Ev2 edge of the p$^+$ Si. As a result, the energy difference between the sub-level L$_{sub}$5 and the sub-level L$_{sub}$6 is larger than the energy band gap Eg1 of the p$^+$ Si.

The energy difference ΔE5 between the conduction band Ec2 edge of the p$^+$ Si and the conduction band edge of the silicon oxynitride film layers 82 is about 4.2 eV, and the energy difference ΔE6 between the valence band Ev2 edge of the p$^+$ Si and the valence band edge of the silicon oxynitride film layers 82 is the same as the energy difference ΔE4. Accordingly, the p-type silicon oxynitride film 8 has a barrier energy (=ΔE6) against holes in the p$^+$ Si that is smaller than a barrier energy (=ΔE5) against electrons in the p$^+$ Si.

Figure 18:
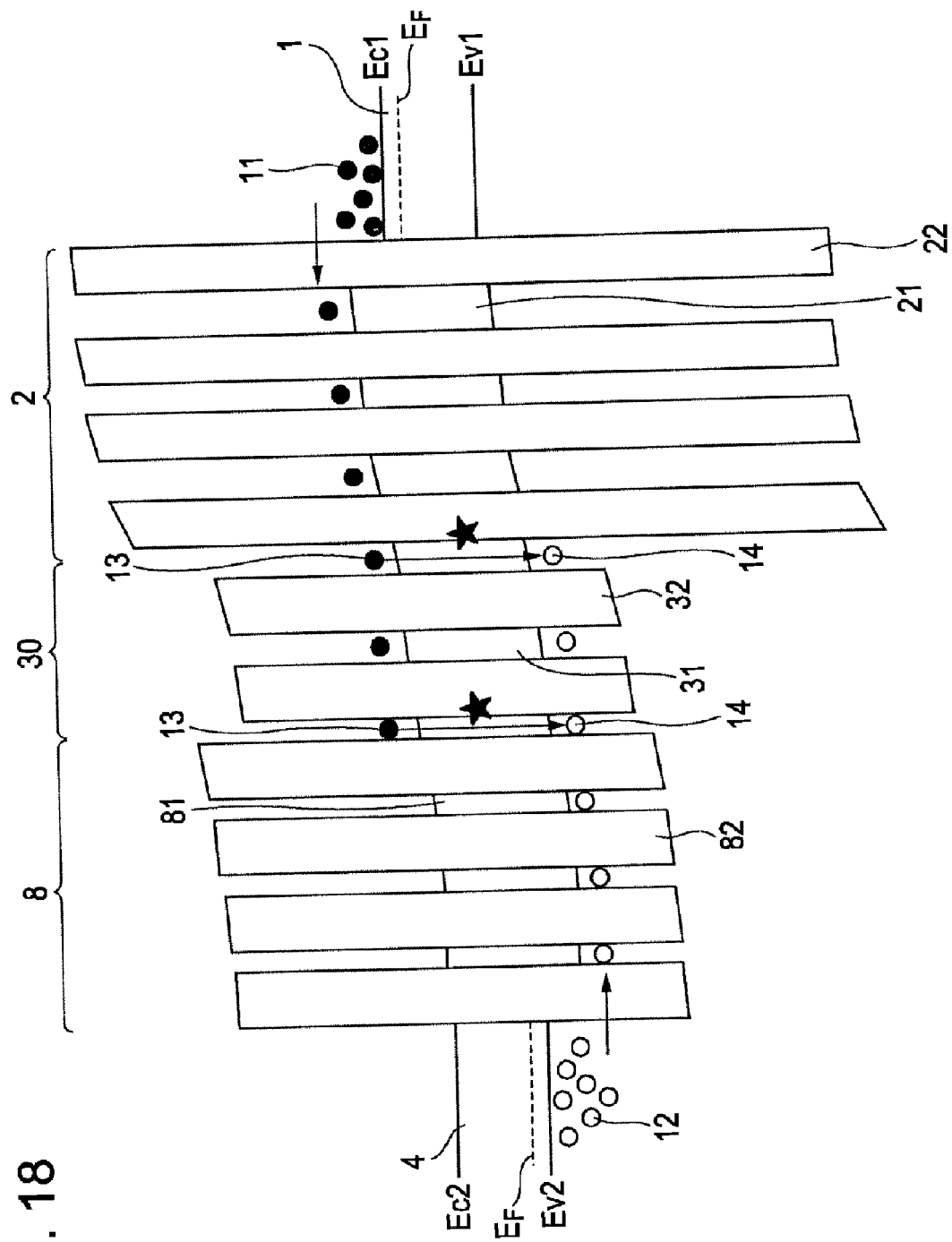
FIG. 18 is an energy band diagram of the light-emitting element shown in FIG. 15 when an electric current is applied.

FIG. 18 is an energy band diagram of the light-emitting element 10B shown in FIG. 15 when an electric current is applied. When a voltage is applied between the electrodes 5 and the electrode 6, assuming that the electrodes 5 side is positive and the electrode 6 side is negative, the energy band of n⁺ Si constituting the substrate 1 is raised. Consequently, electrons 11 in n⁺ Si flow in the n-type silicon oxide film 2 through the plurality of quantum dots 21 included in the n-type silicon oxide film 2, and are injected into the p-type silicon nitride film 30.

Since the p-type silicon oxynitride film 8 has a higher barrier energy against electrons than the p-type silicon nitride film 30, the electrons injected into the p-type silicon nitride film 30 are blocked by the p-type silicon oxynitride film 8 and stored in the quantum dots 31 of the p-type silicon nitride film 30.

In contrast, holes 12 in the p⁺ poly-Si film 4 flow in the p-type silicon oxynitride film 8 through the quantum dots 81 included in the p-type silicon oxynitride film 8, and are injected into the p-type silicon nitride film 30. Since the n-type silicon oxide film 2 has a higher barrier energy against holes than the p-type silicon nitride film 30, the holes injected into the p-type silicon nitride film 30 are blocked by the n-type silicon oxide film 2 and stored in the quantum dots 31 of the p-type silicon nitride film 30.

Then, electrons 13 stored in the quantum dots 31 and holes 14 stored in the quantum dots 31 recombine with each other to emit light.

In the light-emitting element 10B, the electrons injected into the p-type silicon nitride film 30 from the substrate 1 made of n⁺ Si are confined in the p-type silicon nitride film 30 with the p-type silicon oxynitride film 8, while at the same time the holes injected into the p-type silicon nitride film 30 from the p⁺ poly-Si film 4 are confined in the p-type silicon nitride film 30 with the n-type silicon oxide film 2. That is to say, in the light-emitting element 10B, both the holes and electrons are confined in the p-type silicon nitride film 30 by adding the p-type silicon oxynitride film 8 to the light-emitting element 10. As a result, in the light-emitting element 10B, light-emitting efficiency higher than that of the light-emitting element 10 can be achieved.

Furthermore, the n-type silicon oxide film 2, the p-type silicon nitride film 30, and the p-type silicon oxynitride film 8 irregularly include the plurality of quantum dots 21, the plurality of quantum dots 31, and the plurality of quantum dots 81, respectively, whereby the injection efficiency of electrons and holes is improved due to the electric-field enhancement effect caused by the irregularly arranged quantum dots 21, 31, and 81.

Thus, light-emitting efficiency can be improved.

Figure 19:
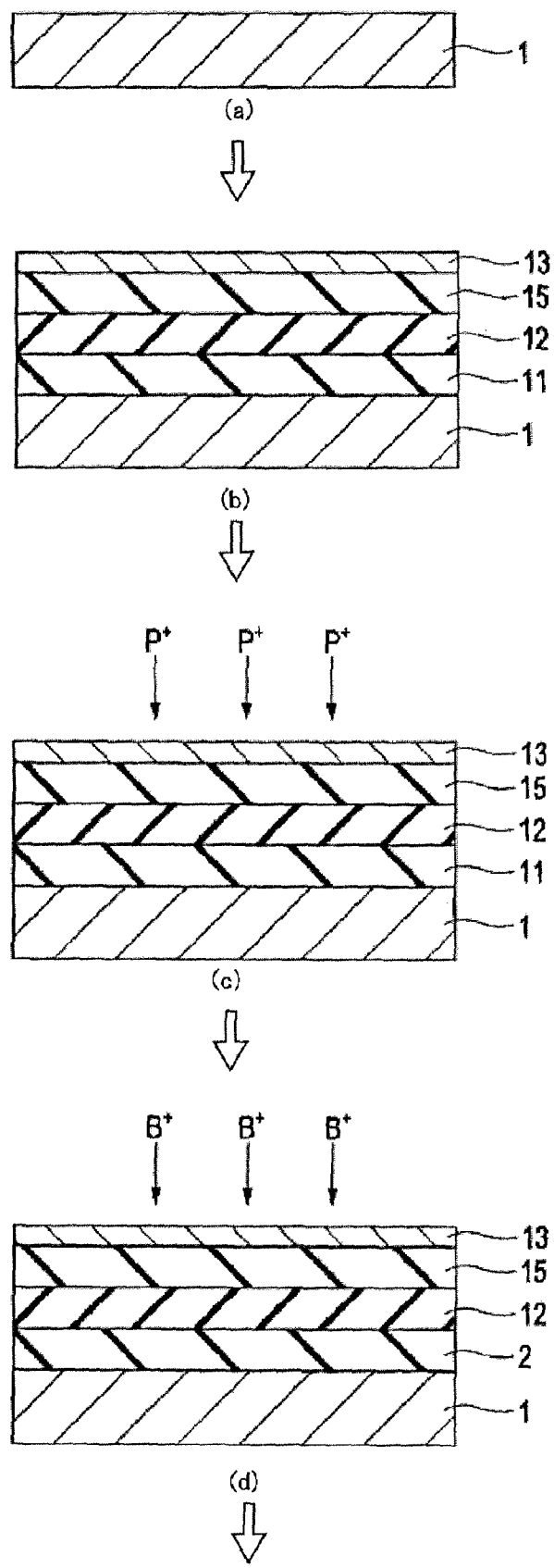
FIG. 19 is a first process chart for describing a method for manufacturing the light-emitting element shown in FIG. 15.
Figure 20:
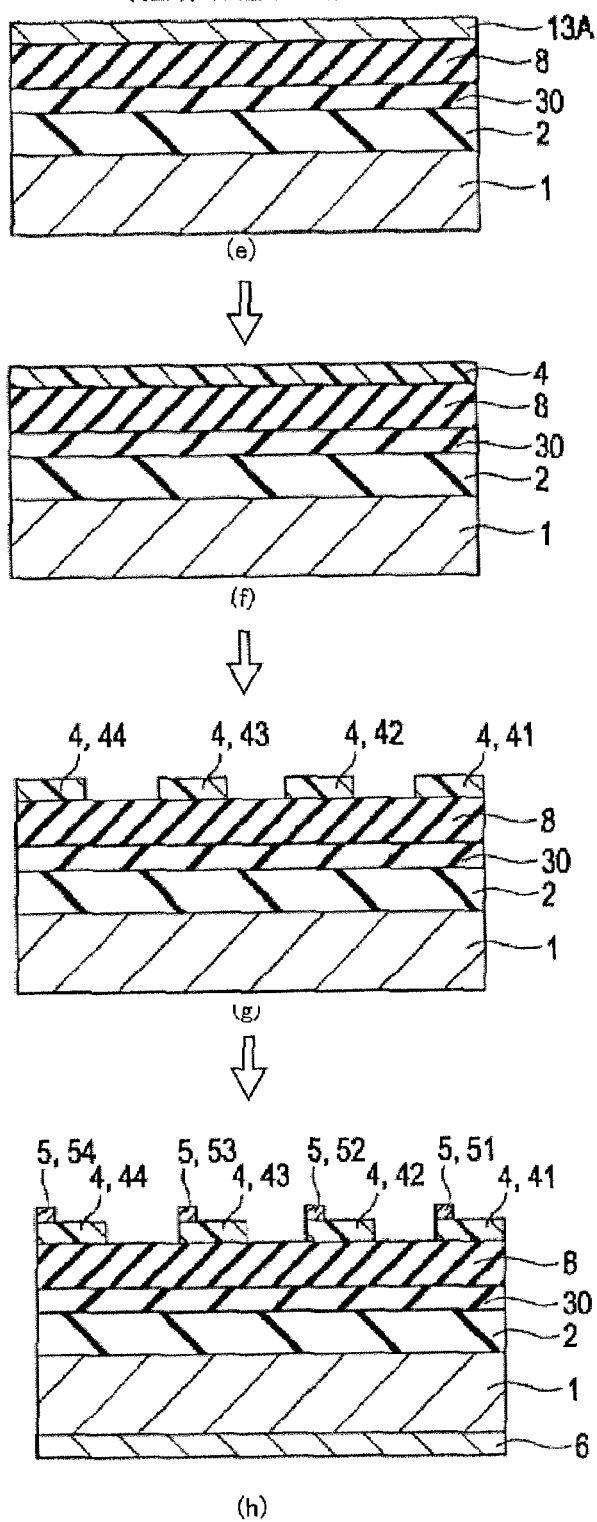
FIG. 20 is a second process chart for describing a method for manufacturing the light-emitting element shown in FIG. 15.

FIGS. 19 and 20 are respectively a first process chart and a second process chart for describing a method for manufacturing the light-emitting element 10B shown in FIG. 15. Referring to FIG. 19, in the manufacturing of the light-emitting element 10B, a substrate 1 made of n⁺ Si is prepared (see process (a) in FIG. 19), cleaned, and placed on the sample holder 103 of the plasma CVD apparatus 100.

A silicon oxide film 11 is deposited on one principal surface of the substrate 1 under the reaction conditions shown in Table 1. A silicon nitride film 12 is then deposited on the silicon oxide film 11 under the reaction conditions shown in Table 2.

A silicon oxynitride film 15 is then deposited on the silicon nitride film 12 under the reaction conditions shown in Table 4.

TABLE 4

| Flow rate of SiH₄ (10%, diluted with H₂) | 96 sccm |
| Flow rate of N₂O (100%) | 6 sccm |
| Flow rate of NH₃ (100%) | 18 sccm |
| Pressure | 133 Pa |
| RF power | 0.32 W/cm² |
| Substrate temperature | 300° C. |
| Reaction time | 4 minutes |

Subsequently, the amorphous silicon (a-Si) film 13 is deposited on the silicon oxynitride film 15 using the reaction conditions shown in Table 2 under which the NH₃ gas is stopped (see process (b) in FIG. 19).

P⁺ ions are then injected into the silicon oxide film 11 by ion implantation (see process (c) in FIG. 19). In this case, the acceleration voltage of ion implantation is adjusted such that the P⁺ ions are injected into only the silicon oxide film 11. Thus, the n-type silicon oxide film 2 is formed (see process (d) in FIG. 19).

B⁺ ions are then injected into the silicon nitride film 12, the silicon oxynitride film 15, and the a-Si film 13 by ion implantation (see process (d) in FIG. 19). In this case, the acceleration voltage of ion implantation is adjusted such that the B⁺ ions are injected into only the silicon nitride film 12, the silicon oxynitride film 15, and the a-Si film 13. Thus, the p-type silicon nitride film 30, the p-type silicon oxynitride film 8, and the p-type a-Si film 13A are formed (see process (e) in FIG. 20).

The resultant structure including the substrate 1/n-type silicon oxide film 2/p-type silicon nitride film 30/p-type silicon oxynitride film 8/p-type a-Si film 13A is annealed under the conditions shown in Table 3.

As a result, P atoms injected into the n-type silicon oxide film 2 and B atoms injected into the p-type silicon nitride film 30 and the p-type silicon oxynitride film 8 are electrically activated. Furthermore, the p-type a-Si film 13A is converted to the p⁺ poly-Si film 4 (see process (f) in FIG. 20).

After that, the processes (g) and (h) in FIG. 7 are conducted to complete the light-emitting element 10B (see processes (g) and (h) in FIG. 20).

The light-emitting element has only to include a light-emitting layer that emits light by recombination of electrons and holes, a first insulator that supplies electrons to the light-emitting layer through n-type quantum dots, and a second insulator that supplies holes to the light-emitting layer through p-type quantum dots. This is because the first and second insulators that respectively supply electrons and holes to the light-emitting layer can contribute to improvement in light-emitting efficiency at the light-emitting layer.

Each of the n-type silicon oxide films 2 and 60 constitutes "the first insulator" and each of the p-type silicon nitride films 3 and 70 constitutes "the second insulator".

The p-type silicon oxynitride film 8 constitutes "a third insulator".

Each of the quantum dots 21 and the quantum dots 63 constitutes "first quantum dots", each of the quantum dots 31 and the quantum dots 73 constitutes "second quantum dots", and the quantum dots 81 constitutes "third quantum dots".

It should be considered that the embodiments disclosed in this entire specification are mere examples and do not limit the present invention. The scope of the present invention is specified by the Claims but not by the descriptions of the above embodiments, and any modification can be made as long as it is within the scope and the spirit of the Claims.

What is claimed is:

1. A light-emitting element comprising:
   a first insulator including first quantum dots with a first conduction type; and
   a second insulator including second quantum dots with a second conduction type that is different from the first conduction type, the second insulator being disposed on the first insulator.

2. The light-emitting element according to claim 1, wherein the first insulator includes a plurality of the first quantum dots, and the second insulator includes a plurality of the second quantum dots.

3. The light-emitting element according to claim 2, wherein the plurality of first quantum dots are irregularly arranged in a thickness direction of the first insulator, and the plurality of second quantum dots are irregularly arranged in a thickness direction of the second insulator.

4. The light-emitting element according to claim 1, wherein the first conduction type is n-type, and the second conduction type is p-type.

5. The light-emitting element according to claim 4, wherein a barrier energy against holes is larger than a barrier energy against electrons in the first insulator, and a barrier energy against electrons is larger than a barrier energy against holes in the second insulator.

6. The light-emitting element according to claim 5, wherein the first quantum dots and the second quantum dots are composed of silicon dots; the first insulator is composed of a silicon oxide film; and the second insulator is composed of a silicon nitride film.

7. The light-emitting element according to claim 4, further comprising a third insulator formed on the second insulator and including third quantum dots with the second conduction type, the third insulator having a larger barrier energy against electrons than the second insulator.

8. The light-emitting element according to claim 7, wherein the third insulator includes a plurality of the third quantum dots.

9. The light-emitting element according to claim 8, wherein the plurality of third quantum dots are irregularly arranged in a thickness direction of the third insulator.

10. The light-emitting element according to claim 9, wherein the first quantum dots, the second quantum dots, and the third quantum dots are composed of silicon dots; the first insulator is composed of a silicon oxide film; the second insulator is composed of a silicon nitride film; and the third insulator is composed of a silicon oxynitride film.

11. A light-emitting element comprising:
    a light-emitting layer;
    a first insulator supplying electrons to the light-emitting layer through n-type quantum dots; and
    a second insulator supplying holes to the light-emitting layer through p-type quantum dots.

12. The light-emitting element according to claim 11, wherein the first insulator is composed of a silicon oxide film and the second insulator is composed of a silicon nitride film.

* * * * *

UNITED STATES PATENT AND TRADEMARK OFFICE
CERTIFICATE OF CORRECTION

PATENT NO. : 8,368,046 B2
APPLICATION NO. : 12/372585
DATED : February 5, 2013
INVENTOR(S) : Yokoyama It is certified that error appears in the above-identified patent and that said Letters Patent is hereby corrected as shown below:

On Title Page 2, Item (56), under "OTHER PUBLICATIONS", in Column 2, Line 13, delete "G" and insert -- G., --, therefor.

In the Specification

In Column 4, Line 5, delete "DESCRIPTION" and insert -- DETAILED DESCRIPTION --, therefor.

In Column 4, Line 60, delete "Ecd" and insert -- Ec1 --, therefor.

In Column 5, Line 2, delete "Ecd" and insert -- Ec1 --, therefor.

In Column 5, Line 22, delete "Ecd" and insert -- Ec1 --, therefor.

In Column 11, Line 49, delete "a)" and insert -- (j) --, therefor.

In Column 12, Line 50, delete "p+Si" and insert -- $p^+$ Si --, therefor.

Signed and Sealed this
Eleventh Day of June, 2013

Teresa Stanek Rea
*Acting Director of the United States Patent and Trademark Office*

UNITED STATES PATENT AND TRADEMARK OFFICE
CERTIFICATE OF CORRECTION

| | | Page 1 of 1 |
|---|---|---|
| PATENT NO. | : 8,368,046 B2 | |
| APPLICATION NO. | : 12/372585 | |
| DATED | : February 5, 2013 | |
| INVENTOR(S) | : Yokoyama | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 422 days.

Signed and Sealed this
Eighteenth Day of November, 2014

Michelle K. Lee
*Deputy Director of the United States Patent and Trademark Office*